US 7,551,488 B2

(12) United States Patent
Tanikawa et al.

(10) Patent No.: US 7,551,488 B2
(45) Date of Patent: Jun. 23, 2009

(54) SEMICONDUCTOR NONVOLATILE MEMORY TRIMMING TECHNIQUE FOR OUTPUT CHARACTERISTIC CONTROL AND REDUNDANCY REPAIR

(75) Inventors: Hiroyuki Tanikawa, Tokyo (JP);
Teruhiro Harada, Tokyo (JP);
Nobukazu Murata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 59 days.

(21) Appl. No.: 11/748,001

(22) Filed: May 14, 2007

(65) Prior Publication Data
US 2008/0043537 A1      Feb. 21, 2008

(30) Foreign Application Priority Data
Aug. 15, 2006   (JP)   ............................. 2006-221479

(51) Int. Cl.
*G11C 16/06*   (2006.01)
(52) U.S. Cl. .............................. 365/185.22; 365/185.11
(58) Field of Classification Search ............ 365/185.11, 365/185.18, 185.22, 185.28, 185.29
See application file for complete search history.

(56) References Cited

U.S. PATENT DOCUMENTS 6,272,586 B1 *   8/2001   Roohparvar et al.   ........ 711/103
6,477,090 B2     11/2002  Yamaki et al.
6,614,689 B2 *   9/2003   Roohparvar   ............ 365/185.22
6,751,122 B2     6/2004   Kawai et al.
7,085,189 B2     8/2006   Horii et al.

FOREIGN PATENT DOCUMENTS

| JP | 11-017010 | 1/1999 |
|---|---|---|
| JP | 2002074997 | 3/2002 |
| JP | 2004152413 | 5/2004 |
| JP | 2005190622 | 7/2005 |
| WO | 03073430 | 9/2003 |

* cited by examiner

*Primary Examiner*—Hoai V Ho
(74) *Attorney, Agent, or Firm*—Volentine & Whitt, P.L.L.C.

(57) ABSTRACT

In a semiconductor nonvolatile memory, plural first nonvolatile memory cells are arranged in the memory array. Plural memory areas are arranged in the memory array and have plural second nonvolatile memory cells which store the same predetermined information. A sequence circuit generates a memory address, a latch selection signal, and a control signal at predetermined timings when a power is turned on. A write-read unit writes and reads information to and from the memory array and the memory areas based on the memory address and the control signal. A latch circuit latches the predetermined information, read by the write-read unit, based on the latch selection signal. A selection-drive unit selects the first or second nonvolatile memory cells based on the memory address and the predetermined information latched by the latch circuit, and applies a predetermined voltage to drive the selected first or second nonvolatile memory cells.

4 Claims, 18 Drawing Sheets

CONFIGURATION OF SEMICONDUCTOR NONVOLATILE MEMORY ACCORDING TO FIRST EMBODIMENT OF THE INVENTION

PATTERN OF MEMORY AREA 3A OR 3B OF FIG. 2

MEMORY AREA 3A OR 3B OF FIG. 2

BUILT-IN POWER SUPPLY CIRCUIT ACCORDING TO SECOND EMBODIMENT OF THE INVENTION

SUPPLY VOLTAGE DIVIDING CIRCUIT IN FIG. 5

| STORAGE LOGICAL VALUE | MEMORY CELL STATE |
|---|---|
| (1, 1) | ND ─ NS  ← 1 / 1 → VOLTAGE APPLICATION DIRECTION DURING READ |
| (0, 1) | CHARGE ACCUMULATION ← 1 / 0 → SMALL CURRENT |
| (1, 0) | ← 0 / 1 → SMALL CURRENT |
| (0, 0) | ← 0 / 0 → |

STORAGE INFORMATION OF BINARY MEMORY CELL ACCORDING TO THIRD EMBODIMENT OF THE INVENTION

READ OPERATION OF TRIMMING AND REDUNDANT INFORMATION WHEN THE SEQUENCE CIRCUIT OF FIG. 8 IS TURNED ON

WAVEFORM CHART OF SUPPLY VOLTAGE VCC WHEN THE SEQUENCE CIRCUIT OF FIG. 8 IS TURNED ON

FIG. 11A MEMORY ADDRESS AND DATA ALLOCATION OF FIG. 1

FIG. 11B

MEMORY ADDRESS AND DATA ALLOCATION OF FIG. 1

MODIFICATION OF READ OPERATION OF TRIMMING AND REDUNDANT INFORMATION WHEN SEQUENCE CIRCUIT OF FIG. 8 IS TURNED ON

FIG. 13

| MEMORY CELL STATE | | | STORAGE VALUE OF TRIMMING INFORMATION LATCH CIRCUIT | PRESENCE/ABSENCE OF MEMORY CELL STATE (NORMAL) | | |
|---|---|---|---|---|---|---|
| DI15 | DI11~DI8 | DI3~DI0 | | UNWRITTEN | POST-WRITE | POST-REWRITE |
| 1 | 1 | 1 | 0 | O | | |
| 1 | 1 | 0 | 1 | | O | |
| 1 | 0 | 1 | 0 | | O | |
| 1 | 0 | 0 | 1 | | | |
| 0 | 1 | 1 | 0 | | | |
| 0 | 1 | 0 | 0 | | | O |
| 0 | 0 | 1 | 1 | | | O |
| 0 | 0 | 0 | 1 | | | O |

LOGICAL VALUE OF TRIMMING INFORMATION OF FIGS. 11A AND 11B IN FIFTH EMBODIMENT OF THE INVENTION

FIG. 14

| MEMORY CELL STATE | | STORAGE VALUE OF REDUNDANCY ENABLE/DISABLE INFORMATION LATCH CIRCUIT | PRESENCE/ABSENCE OF MEMORY CELL STATE (NORMAL) | | |
|---|---|---|---|---|---|
| DI15~DI8 | DI7~DI0 | | UNWRITTEN | POST-WRITE | POST-REWRITE |
| 1 | 1 | 0 (ADDRESS DISABLE) | ○ | | |
| 1 | 0 | 1 (ADDRESS ENABLE) | | ○ | ○ |
| 0 | 0 | 0 (ADDRESS DISABLE) | | ○ | ○ |
| 0 | 1 | 0 (ADDRESS DISABLE) | | | ○ |

LOGICAL VALUE OF REDUNDANCY ENABLE/DISABLE INFORMATION OF FIGS. 11A AND 11B IN FIFTH EMBODIMENT OF THE INVENTION

REFERENCE CURRENT TRIMMING VALUE AUTOMATICALLY OPTIMIZING CIRCUIT ACCORDING TO SEVENTH EMBODIMENT OF THE INVENTION PROVIDED IN THE BUILT-IN POWER SUPPLY CIRCUIT OF FIGS 1 AND 5

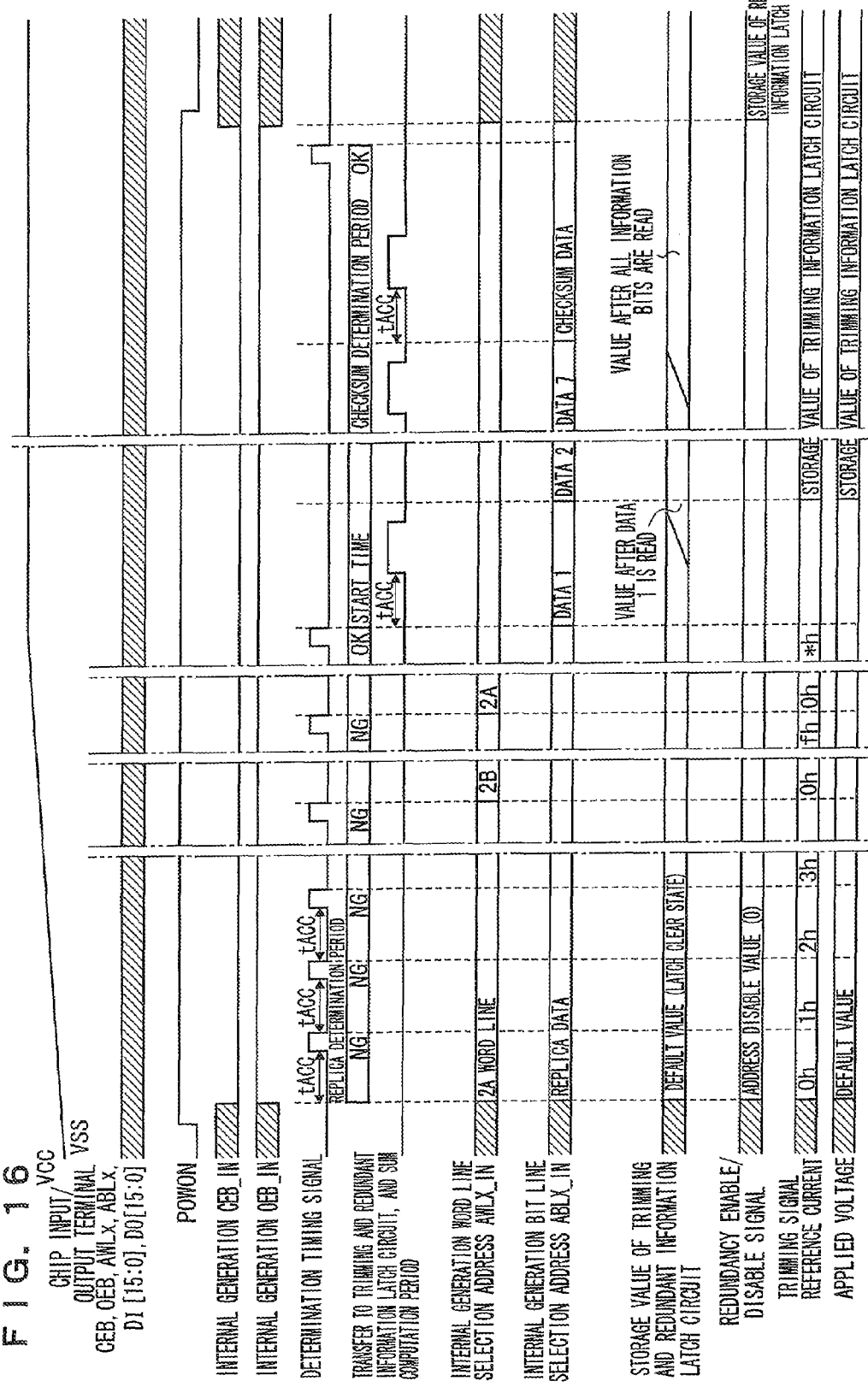

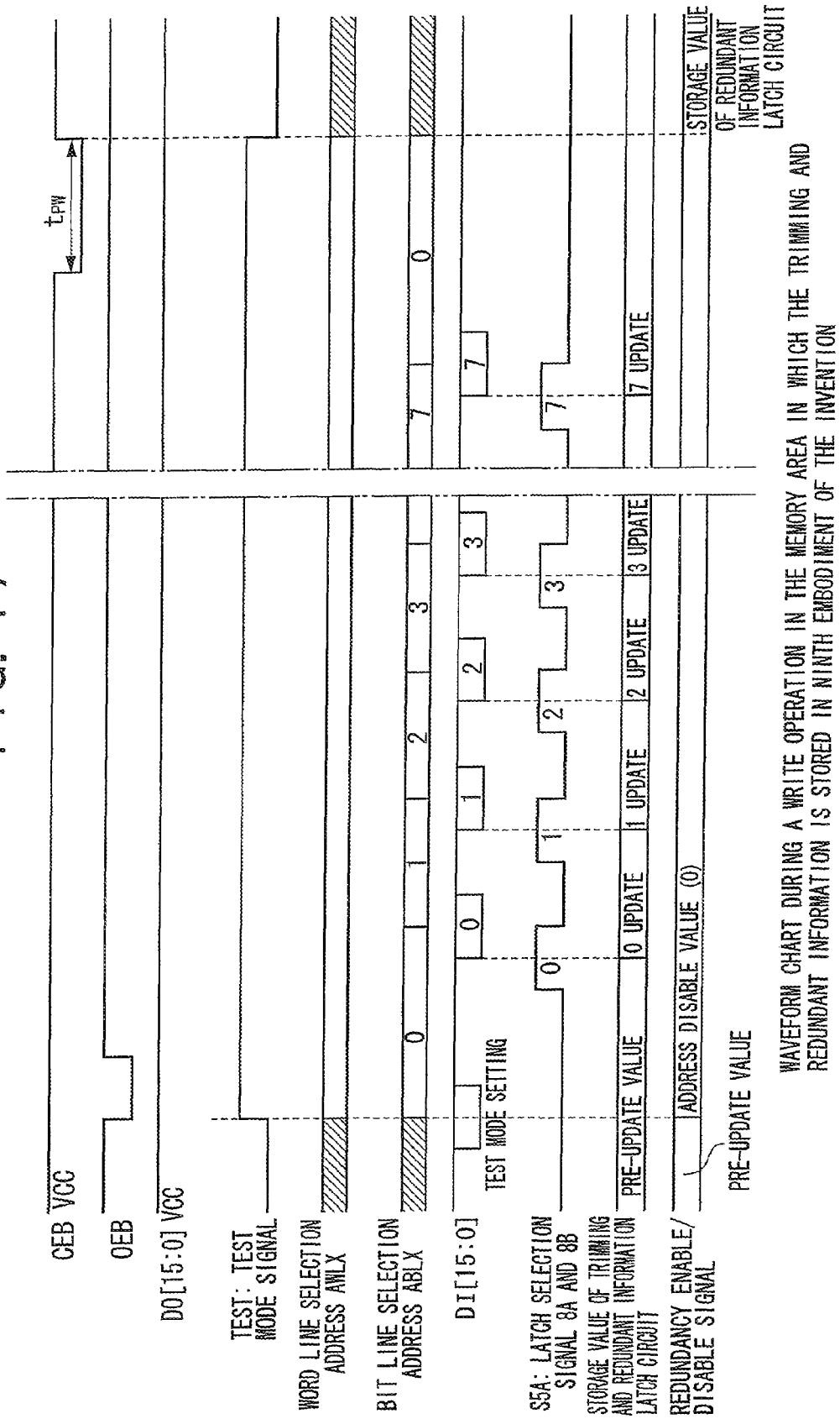

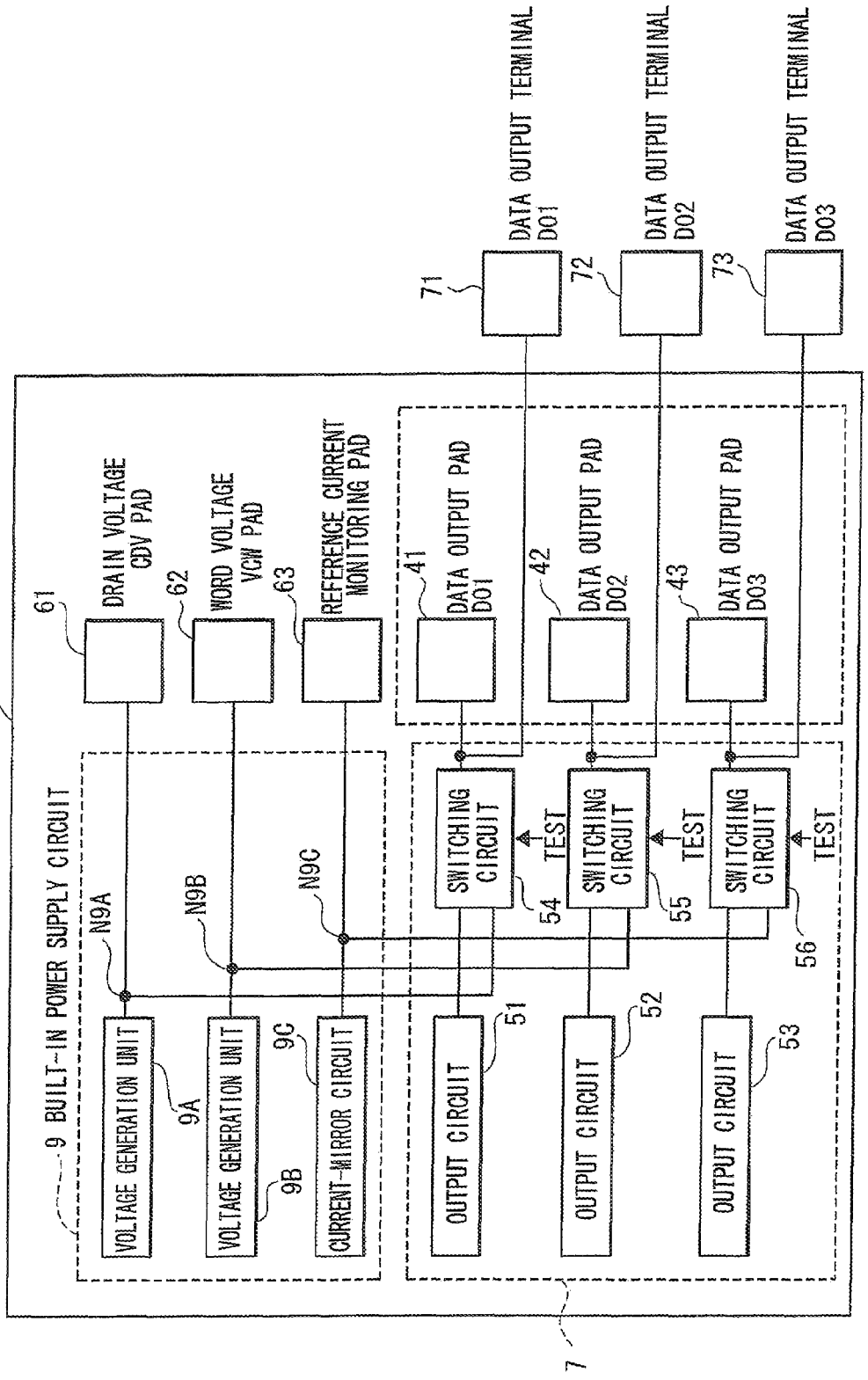

SEMICONDUCTOR NONVOLATILE MEMORY TRIMMING TECHNIQUE FOR OUTPUT CHARACTERISTIC CONTROL AND REDUNDANCY REPAIR

CROSS-REFERENCE TO RELATED APPLICATION

This application claims priority under 35 USC 119 from Japanese Patent Application No. 2006-221479, the disclosure of which is incorporated by reference herein.

BACKGROUND OF THE INVENTION

1. Field of the Invention

The present invention relates to a semiconductor nonvolatile memory such as an electrically programmable read-only memory (hereinafter referred to as "EPROM"), particularly to a trimming technique for output characteristic control and redundancy repair of a memory chip built-in circuit.

2. Description of the Related Art

Semiconductor nonvolatile memories such as EPROM are widely utilized as a memory for a portable device and the like because electric power is not required to retain storage information. Recently, as memory cells become finer, update of the memory cell, optimal control of a read condition, and redundancy repair become important in order to improve reliability and a yield of the memory. The update of the memory cell, the optimal control of the read condition, and the redundancy repair are realized by referring to trimming and redundant information during a memory operation. The trimming and redundant information is previously stored in the memory chip, and specifies voltage and current supplied to a built-in circuit, the presence/absence of redundancy line activation, and a substitute address. For example, as disclosed in Japanese Patent Application Laid-Open No. 11-17010, laser fuse trimming is usually performed as a method of storing the trimming and redundant information.

In the method disclosed in Japanese Patent Application Laid-Open No. 11-17010, a fuse element is used to store information. For example, the fuse is selectively cut in a wafer test process, and a logic signal of "0" or "1" is generated as information on the presence/absence of the cutting during the memory operation.

However, in the laser fuse trimming disclosed in Japanese Patent Application Laid-Open No. 11-17010, because the trimming and redundancy (repair) information cannot be updated after package assembly, all the memory chips become defect, when a memory area which needs repair is generated in the test process after the assembly, or when output characteristics of the built-in circuit are shifted in the memory chip. Furthermore, a dedicated mask is required to mount the fuse element, which results in that production cost is increased by the dedicated mask.

SUMMARY OF THE INVENTION

The present invention has been made in view of the above circumstances and provides a semiconductor nonvolatile memory.

According to an aspect of the invention, there is provided a semiconductor nonvolatile memory comprising: a memory array in which a plurality of first nonvolatile memory cells are arranged; a plurality of memory areas which are arranged in the memory array and have a plurality of second nonvolatile memory cells in which the same predetermined information is stored; a sequence circuit which generates a memory address, a latch selection signal, and a control signal at predetermined timings when a power is turned on; a write-read unit which writes and reads information in and from the memory array and the memory areas based on the memory address and the control signal; a latch circuit which latches the predetermined information which is read by the write-read unit, based on the latch selection signal; and a selection-drive unit which selects the first or second nonvolatile memory cells based on the memory address and the predetermined information latched by the latch circuit and applies a predetermined voltage to drive the selected first or second nonvolatile memory cells.

BRIEF DESCRIPTION OF THE DRAWINGS

Preferred embodiments of the present invention will be descried in detail based on the following figures, wherein:

FIG. 9 is a flowchart showing a read operation of trimming and redundant information when the sequence circuit 5 of FIG. 8 is turned on;

FIG. 10 is a waveform chart of a supply voltage VCC when the sequence circuit 5 of FIG. 8 is turned on;

FIG. 11A shows a memory address and data allocation when the trimming and redundant information is stored in the memory areas 3A and 3B of FIG. 1, and FIG. 11B shows a memory address and data allocation when the trimming and redundant information is stored in the memory areas 3A and 3B of FIG. 1;

FIG. 12 is a flowchart showing a modification of the read operation of the trimming and redundant information when the sequence circuit 5 of FIG. 8 is turned on;

FIG. 13 shows a logical value of trimming information of FIGS. 11A and 11B in a fifth embodiment of the invention;

FIG. 14 shows a logical value of redundancy enable/disable information of FIGS. 11A and 11B in the fifth embodiment of the invention;

FIG. 16 is a waveform chart showing a power-on sequence in which the reference current trimming value automatically optimizing circuit of FIGS. 8 and 15 is used;

FIG. 17 is a waveform chart showing a write operation in which the trimming and redundant information is stored in the memory area of FIGS. 1 and 8 in a ninth embodiment of the invention; and FIG. 18 is a block diagram showing trimming terminals of FIG. 1 in a tenth embodiment.

DETAILED DESCRIPTION OF THE INVENTION

First Embodiment (Entire Configuration of Semiconductor Nonvolatile Memory)

Figure 1:
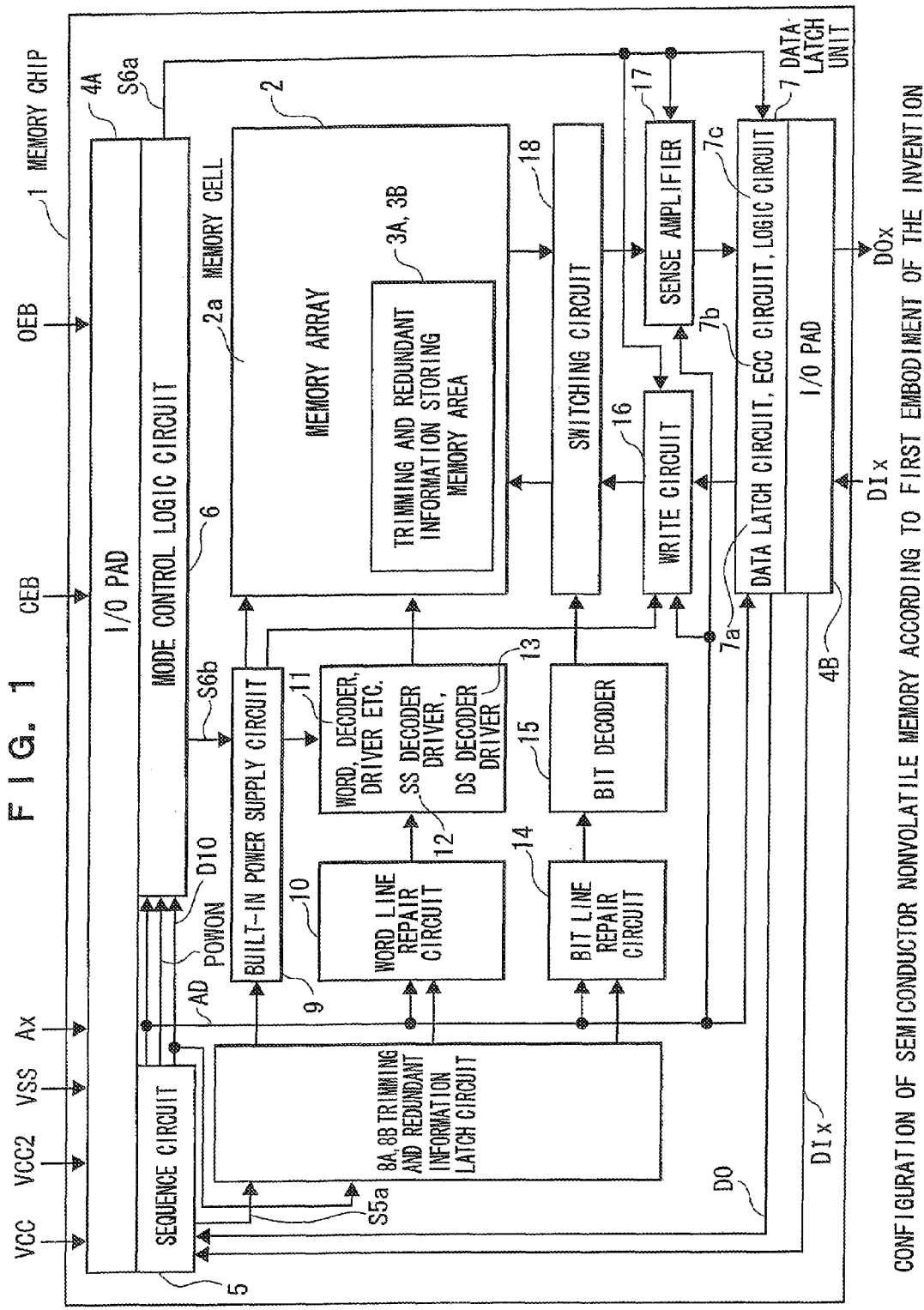
FIG. 1 is a block diagram showing a schematic configuration of a semiconductor nonvolatile memory according to a first embodiment of the invention.
Figure 2:
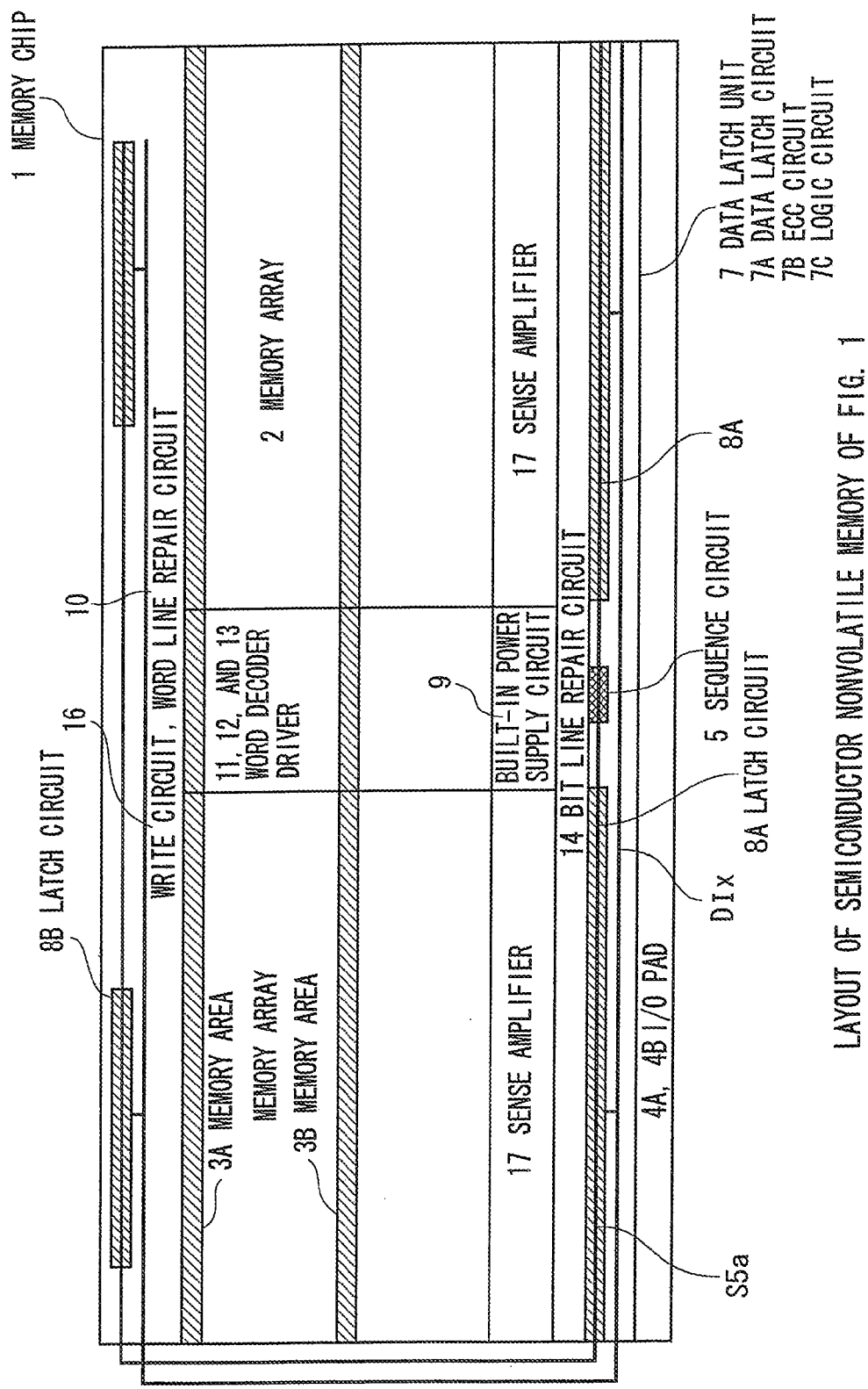
FIG. 2 is a plan view showing a layout of the semiconductor nonvolatile memory of FIG. 1.

FIG. 1 is a block diagram showing a schematic configuration of a semiconductor nonvolatile memory according to a first embodiment of the invention, and FIG. 2 is a plan view showing a layout of the semiconductor nonvolatile memory of FIG. 1.

The semiconductor nonvolatile memory is a kind of EPROM and a memory called P2ROM (Product Programmed ROM, registered trademark of Oki Electric Industry Co., Ltd.) having a floating gate structure in the memory cell. In the semiconductor nonvolatile memory, a memory array 2 is provided in the substantial center of a memory clip 1, and the memory array 2 is a user data storage area where many memory cells 2a are arranged in a matrix shape. In the memory array 2, plural (for example, two) memory areas 3A and 3B in which the trimming and redundant information is stored are provided at predetermined positions separated from each other by a predetermined distance.

The memory cell 2a is formed by a MOS transistor having a structure in which a charge can be accumulated in a floating gate by an electric method, and the charge is erased by an ultraviolet ray or voltage application. A drain and a source of the memory cell 2a are connected to a pair of bit lines BL respectively. After all the cells are erased, using a word line WL which is of an address line, the information is written in the memory cell 2a by selectively accumulating the charge in the floating gate of the memory cell 2a. The accumulated charge can be retained until erased next time even if the power is turned off.

Input/output (hereinafter referred to as "I/O") pads 4A and 4B, a sequence circuit 5, a mode control logic circuit 6, a data latch unlit 7, latch circuits 8A and 8B, a built-in power supply circuit 9, a word line repair circuit 10, a word decoder driver 11, an SS decoder driver 12, a DS decoder driver 13, a bit line repair circuit 14, a bit decoder 15, a write circuit 16, a sense amplifying unit (hereinafter referred to as "sense amplifier") 17, and a switching circuit 18 are provided around the memory array 2. The write-read unit is formed by the I/O pad 4B, the data latch unit 7, the write circuit 16, the sense amplifier 17, and the switching circuit 18. The selection drive unit is formed by the built-in power supply circuit 9, the word line repair circuit 10, the word decoder driver 11, the SS decoder driver 12, the DS decoder driver 13, the bit line repair circuit 14, and the bit decoder 15.

The I/O pad 4A is a terminal to which supply voltages VCC and VCC2, a ground voltage VSS, a memory address Ax (x is a positive integer), a chip enable signal CEB, and an output enable signal OEB are inputted. The I/O pad 4B is a terminal through which input of input data DIx and output of output data DOx are performed. The sequence circuit 5 inputs the supply voltage VCC, the memory address Ax, the input data DIx, and the memory read data DO to generate various signals (such as latch selection signal S5a, memory address AD, and input/output data DIO). The mode control logic circuit 6 inputs a memory address AD, a power-on signal POWON and an input/output data DIO to generate mode control signals S6a and S6b. The data latch unit 7 includes a data latch circuit 7a, an error correction circuit (hereinafter referred to as "ECC circuit") 7b, and a logic circuit 7c. The data latch circuit 7a latches the input data DIx and the output data DOx (i.e., memory read data DO) based on the memory address AD and the control signal S6a.

The latch circuits 8A and 8B latch the trimming and redundant information based on the latch selection signal S5a and the input/output data DIO. The built-in power supply circuit 9 outputs plural drive voltages based on output signals of the latch circuit 8A and 8B. The word line repair circuit 10 repairs the word line WL based on the memory address AD and the output signals of the latch circuits 8A and 8B. The word decoder driver 11 decodes the output signal of the word line repair circuit 10 to drive the word line WL. The SS decoder driver 12 decodes the output signal of the word line repair circuit 10 to drive a gate line SS of the source selection transistor. The DS decoder driver 13 decodes the output signal of the word line repair circuit 10 to drive a gate line DS of the drain selection transistor.

The bit line repair circuit 14 repairs the bit line BL based on the memory address AD and the output signals of the latch circuits 8A and 8B. The bit decoder 15 decodes the output signal of the bit line repair circuit 14. The write circuit 16 writes the input data DIx based on the memory address AD and the control signal S6a. The sense amplifier 17 amplifies the memory read data DO based on the memory address AD and the control signal S6a. The switching circuit 18 switches the data write and the data read for the memory array 2 and the memory areas 3A and 3B.

(Entire Operation of Semiconductor Nonvolatile Memory)

For the trimming and redundant information, in a semiconductor device manufacturer, a test mode is set, the memory address Ax is designated to select the memory areas 3A and 3B, and writing and verification are performed. Therefore, the trimming and redundant information is stored prior to shipment to a user.

That is, the memory address Ax is inputted to the I/O pad 4A, the trimming and redundant information is inputted as the input data DIx to the I/O pad 4B, and the test mode is set by the mode control logic circuit 6. Then, the input data DIx of the trimming and redundant information is inputted to the I/O pad 4B and latched by the data latch circuit 7a.

The memory address Ax is inputted to the sequence circuit 5 through the I/O pad 4A. The word decoder driver 11, the SS decoder driver 12, and the DS decoder driver 13 decode the memory address AD which is output from the sequence circuit 5 through the word line repair circuit 10 to select the word lines WL, the source lines SL, and the drain lines DL of the memory areas 3A and 3B. The bit decoder 15 decodes the memory address AD through the bit line repair circuit 14 to select the bit lines BL of the memory areas 3A and 3B. Thus, the memory cells 2a are selected in the memory areas 3A and 3B.

The input data DIx of the trimming and redundant information latched by the data latch circuit 7a is stored in the memory cells 2a selected in the memory areas 3A and 3B through the write circuit 16 and the switching circuit 18.

For example, when a user applies the supply voltage VCC and VCC2 to the memory chip 1, the sequence circuit 5 is operated to automatically output the addresses AD of the memory areas 3A and 3B, and the memory chip 1 is set to a read operation mode by the mode control logic circuit 6. The memory cells 2a in the memory areas 3A and 3B are selected based on the automatically-outputted address AD, and the trimming and redundant information stored in the memory cell 2a is read to the data latch circuit 7a through the switching circuit 18 and the sense amplifier 17.

The trimming and redundant information read to the data latch circuit 7a is stored in the latch circuits 8A and 8B which are selected by the latch selection signal S5a generated from the sequence circuit 5. After all the pieces of trimming and redundant information are stored in the latch circuits 8A and 8B, the read operation mode set by the mode control logic circuit 6 is automatically ended, and a normal memory operation can be performed to the memory array 2. The trimming and redundant information stored in the latch circuits 8A and 8B is retained while electric power is supplied to the memory chip 1, and is supplied to the built-in power supply circuit 9, the word line repair circuit 10, and the bit line repair circuit 14.

(Configurations of Memory Areas 3A and 3B)

Figure 3:
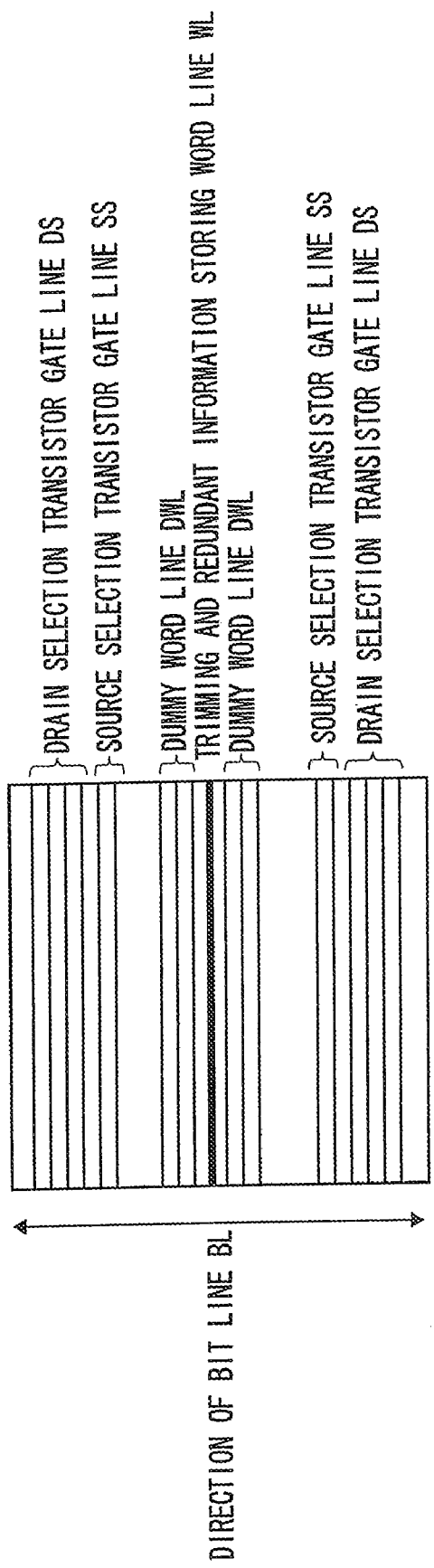
FIG. 3 is a plan view schematically showing a pattern of a memory area 3A or 3B of FIG. 2.

FIG. 3 is a plan view schematically showing a pattern of the memory area 3A or 3B of FIG. 2. FIG. 3 shows the detailed pattern when the memory area 3A or 3B is regarded as the one word line WL.

In FIG. 3, a vertical direction indicates a direction of the bit line BL, and one trimming and redundant information storing word line WL extended in a horizontal direction is arranged in the substantial center in the direction of the bit line BL in order to select the trimming and redundant information storing memory cell 2a. Plural dummy word lines DWL, the plural gate lines SS of the source selection transistor, and the plural gate lines DS of the drain selection transistor are arranged in parallel with the word line WL while being symmetrical with respect to the word line WL.

In the first embodiment, the same trimming and redundant information is stored in the two memory areas 3A and 3B in the overlapping manner. The transistor gate lines SS and DS for selecting the source and drain are provided with respect to the word line WL in which the trimming and redundant information is stored, and thereby, during writing and reading, the voltage application can be controlled independently of the word line WL in which other pieces of information such as user data are stored. When the same information is stored in the overlapping manner, like the memory areas 3A and 3B of FIG. 2, the two configurations of FIG. 3 are prepared without using the same word line WL or the adjacent word line WL.

Figure 4:
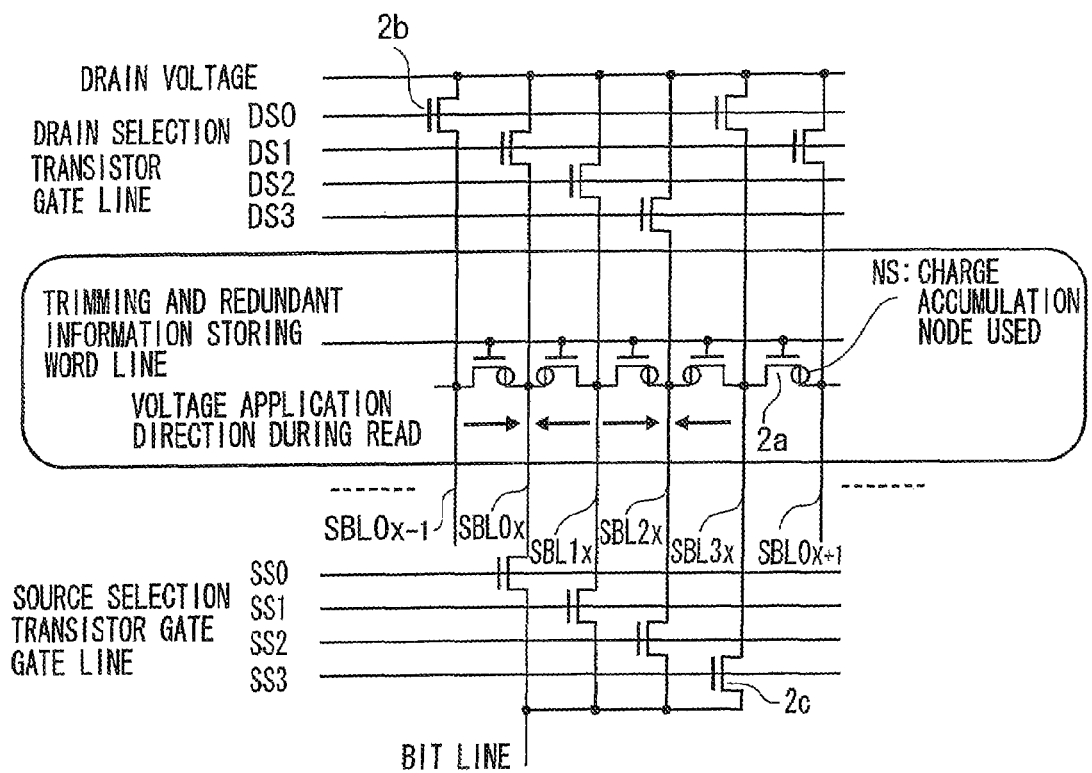
FIG. 4 is a circuit diagram schematically showing the memory area 3A or 3B of FIG. 2.

FIG. 4 is a circuit diagram schematically showing the memory area 3A or 3B of FIG. 2 which correspond to the pattern of FIG. 3.

The one trimming and redundant information storing word line WL is horizontally arranged, and the plural main bit lines BLx is arranged while being orthogonal to the trimming and redundant information storing word line WL. The memory cells 2a are arranged at intersects where the one word line WL and sub-bit lines SBLnx (n and x are positive integer) respectively. The gate of each memory cell 2a is connected to the word line WL, and the drain and source are connected to the sub-bit lines SBLnx.

A drain voltage CDV is applied to an upper end of each sub-bit line SBLnx through each drain selection transistor 2b, and a lower end of each sub-bit line SBLnx is connected to a main bit line BLx through each source selection transistor 2c. The drain selection transistor 2b performs on-off operation by the voltage applied to the gate line DS connected to each gate. Similarly the source selection transistor 2c performs on-off operation by the voltage applied to the gate line SS connected to each gate.

(Operations of Memory Areas 3A and 3B)

As described above, when the memory chip 1 of FIG. 1 is turned on, the sequence circuit 5 automatically outputs the memory addresses AD of the memory areas 3A and 3B, and the mode control logic circuit 6 set the memory chip 1 in the read operation mode. The memory cells 2a in the memory areas 3A and 3B are selected based on the automatically outputted memory addresses AD, the trimming and redundant information stored in the memory cell 2a is read to the data latch circuit 7a through the switching circuit 18 and the sense amplifier 17.

In the read operation when the power is turned on, the two memory areas 3A and 3B are alternatively selected, a determination circuit in the sequence circuit 5 determines whether or not the written information is correctly read, and the read operation is performed to the trimming and redundant information of the memory areas 3A or 3B, which is determined that the written information is correctly read, is read.

(Effect of First Embodiment)

According to the first embodiment, the same trimming and redundant information is stored in the two memory areas 3A and 3B in the overlapping manner, so that the reliability can be enhanced in the memory areas 3A and 3B in which the trimming and redundant information is stored. Because the memory block is formed only by the memory areas 3A or 3B in which the trimming and redundant information is stored, the stored trimming and redundant information is not simultaneously erased nor disturbed when another memory array 2 is erased, which allows the reliability of the memory areas 3A and 3B to be enhanced while facilitating test. Furthermore, as shown in FIG. 2, the two memory areas 3A and 3B are arranged and separated from each other by a predetermined distance, and the two memory areas 3A and 3B are not adjacent with each other. Therefore, a defect caused by short between lines can be prevented, which is generated by adhesion of dust or high voltage during writing.

Second Embodiment (Configuration of Second Embodiment)

Figure 5:
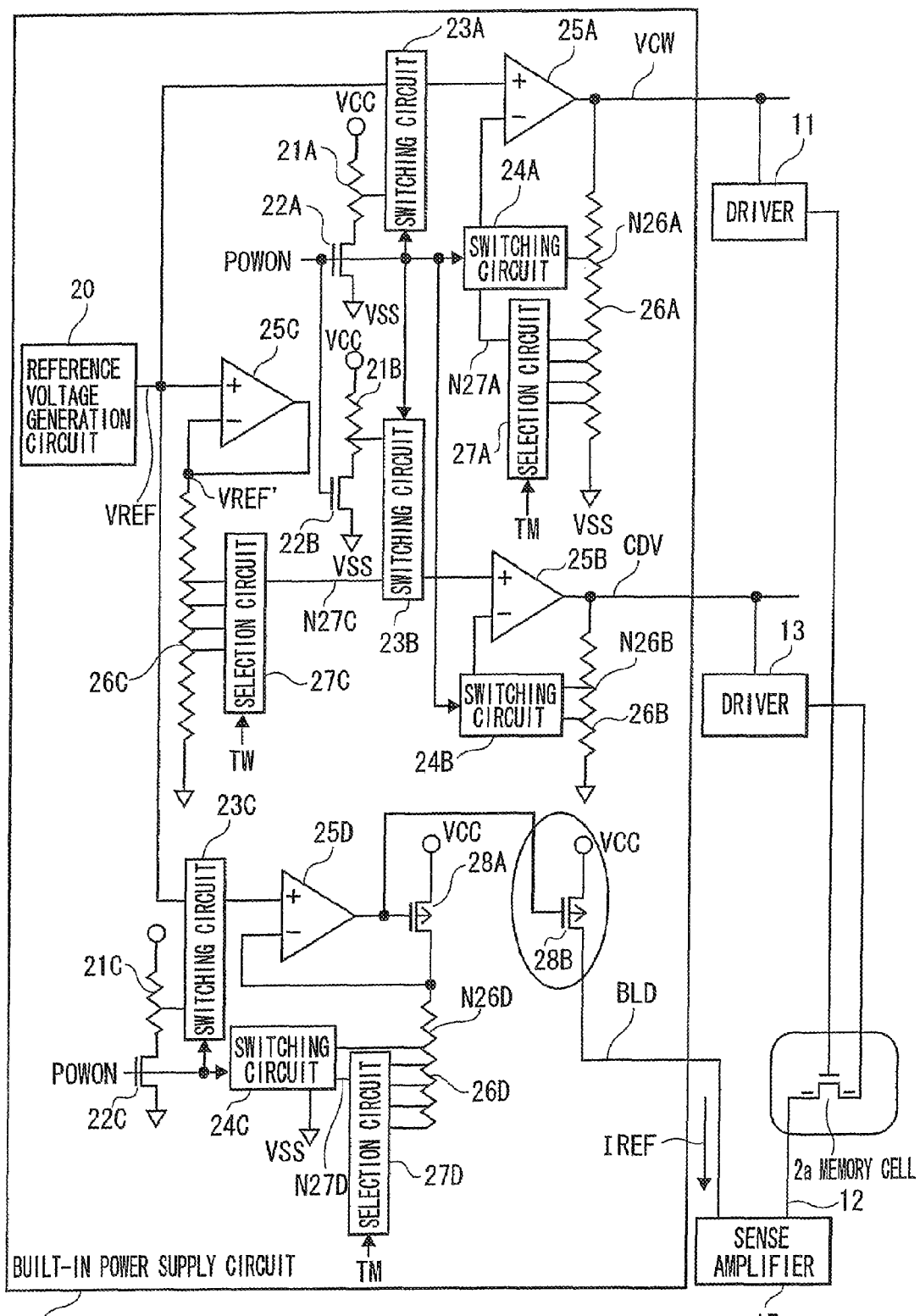
FIG. 5 is a schematic view showing a configuration of a built-in power supply circuit 9 of FIG. 1 according to a second embodiment of the invention.

FIG. 5 is a schematic view showing a configuration of a built-in power supply circuit 9 according to a second embodiment of the invention.

The built-in power supply circuit 9 is a power supply circuit used in the read operation. The built-in power supply circuit 9 includes a reference voltage generation circuit 20, supply voltage dividing circuits 21A, 21B, and 21C, N-channel MOS transistors (hereinafter referred to as "NMOS") 22A, 22B, and 22C, switching circuits 23A, 23B, and 23C, switching circuits 24A, 24B, and 24C, voltage nodes N26A, N26B, and N26D and voltage nodes N27A, N27B, and N27D. The reference voltage generation circuit 20 generates a reference voltage VREF. The supply voltage dividing circuits 21A, 21B, and 21C are formed by voltage dividing resistors which supply output voltages into which the supply voltage VCC supplied to the memory chip 1 is divided. The NMOS transistors 22A, 22B, and 22C perform the on-off operation by a power-on signal POWON to pass a power supply current to the supply voltage dividing circuits 21A, 21B, and 21C. The switching circuits 23A, 23B, and 23C select the output voltages of the supply voltage dividing circuits 21A, 21B, and 21C when the power is turned on by the power-on signal POWON, and select the reference voltage VREF or the voltage of the voltage node N27C selected by a trimming signal TM when the read operation is usually performed. The switching circuits 24A, 24B, and 24C select the voltage nodes N26A, N26B, and N26D which are selected irrespective of the trimming signal TM when the power is turned on by the power-on signal POWON, and select the voltage nodes N27A, N27B, and N27D selected by the trimming signal TM when the read operation is performed.

The built-in power supply circuit 9 further includes operational amplifiers 25A to 25D, and resistor dividing circuits 26A to 26D. The operational amplifier 25A causes the output voltage (i.e., a word voltage VCW supplied to the word decoder driver 11) of the switching circuit 24A to follow the output voltage of the switching circuit 23A. The operational amplifier 25B causes the output voltage (i.e., a drain voltage CDV supplied to the DS decoder driver 13) to follow the output voltage of the switching circuit 23B. The reference voltage VRFF is inputted to the operational amplifier 25C, and the operational amplifier 25C outputs a stable reference voltage VREF'. The output voltage of the switching circuit 23C is inputted to the operational amplifier 25D, and the operational amplifier 25D outputs the stable voltage. The resistor dividing circuit 26A divides the voltage between the word voltage VCW and the ground voltage VSS to output the divided voltage from the voltage node N26A. The resistor dividing circuit 26B divides the voltage between the drain voltage CDV and the ground voltage VSS to output the divided voltage from the voltage node N26B. The resistor dividing circuit 26C divides the voltage between the output voltage of the operational amplifier 25C and the ground voltage VSS. The resistor dividing circuit 26D divides the voltage on a negative-side input terminal of the operational amplifier 25D to output the divided voltage from the voltage node N26D.

The built-in power supply circuit 9 further includes selection circuits 27A to 27D, a current source 28A, and a reference current source 28B. The selection circuit 27A selects a desired output voltage of the resistor dividing circuit 26A based on the trimming signal TM, and supplies the desired output voltage to the switching circuit 24A through the voltage node N27A. The selection circuit 27C selects a desired output voltage of the resistor dividing circuit 26C based on the trimming signal TM, and supplies the desired output voltage to the switching circuit 23B through the voltage node N27C. The selection circuit 27D selects a desired output voltage of the resistor dividing circuit 26D based on the trimming signal TM, and supplies the desired output voltage to the switching circuit 24C through the voltage node N27D. The current source 28A is formed by a P-channel MOS (hereinafter referred to as "PMOS") transistor. The gate of the current source 28A is controlled by the output voltage of the operational amplifier 25D, and thereby the current source 78A passes the constant power supply current. The reference current source 28B is formed by the PMOS transistor. The reference current source 28B is connected to the current source 28A in a current-mirror manner to pass a constant reference current IREF through a reference bit line BLD.

The word decoder driver 11 is connected to an output terminal of the operational amplifier 25A which outputs the word voltage VCW. The word decoder driver 11 decodes the memory address Ax, and supplies the word voltage VCW to the gate of the memory cell 2a based on the decoding result. The DS decoder driver 13 is connected to an output terminal of the operational amplifier 25B which outputs the drain voltage CDV. The DS decoder driver 13 decodes the memory address Ax, and supplies the drain voltage CDV to the drain of the memory cell 2a based on the decoding result. Although not shown in FIG. 5, the source of the memory cell 2a is connected to the sense amplifier 17 through the SS decoder driver 12 of FIG. 1. The sense amplifier 17 amplifies a difference between the reference current IREF supplied from the reference bit line BLD and read current on the source side of the memory cell 2a, and outputs the amplified read voltage to the data latch circuit 7a.

(Operation in Second Embodiment)

When the trimming and redundant information is read from the memory areas 3A and 3B when the power is turned on, unlike the normal read operation, the trimming and redundant information should be read with the built-in power supply circuit 9 which is in the pre-trimming state. Therefore, the voltage applied to the memory cell 2a or the reference current IREF used to sense (detect) the memory cell current fluctuates largely depending on the built-in power supply circuit 9, particularly elements constituting the reference voltage generation circuit 20. When an upper limit of the voltage applied to the memory cell 2a is defined in order to secure the reliability, the voltage applied to the memory cell 2a becomes largely decreased in the worst condition due to the fluctuation of the elements, so that the memory cell current necessary for the read operation cannot be secured. Similarly, the read operation is hardly performed because of the large fluctuation of the reference current source 28B in which the reference voltage generation circuit 20 is used.

Therefore, in the second embodiment, the supply voltage dividing circuits 21A, 21B, and 21C are used when the trimming and redundant information is read. A built-in power supply control passage selected by the trimming signal TM is switched from the passage during the normal read operation (i.e., the passage of reference voltage VREF→switching circuit 23A→operational amplifier 25A, the passage of reference voltage VREF→operational amplifier 25C→resistor dividing circuit 26C→selection circuit 27C→switching circuit 23B→operational amplifier 25B, and the passage of reference voltage VREF→switching circuit 23C→operational amplifier 25D) to the dedicated control passage (i.e., passage of supply voltage dividing circuits 21A, 21B, and 21C→switching circuits 23A, 23B, and 23C→operational amplifiers 25A, 25B, and 25D). Consequently, the fluctuation in voltage applied to the memory cell 2a can be decreased within a range of a fluctuation in the divided voltages of the supply voltage VCC. Furthermore, in the reference current source 28B, the fluctuation attributed to the reference voltage generation circuit 20 can be decreased.

(Effect of Second Embodiment)

According to the second embodiment, the memory cell current is secured when the power is turned on, and the fluctuation on reference current IREF can be decreased, so that the trimming and redundant information can securely be read.

(Modification of Second Embodiment)

(1) The supply voltage dividing circuits 21A, 21B, and 21C can commonly be used. Therefore, a circuit area can be decreased.

Figures 6, 7:
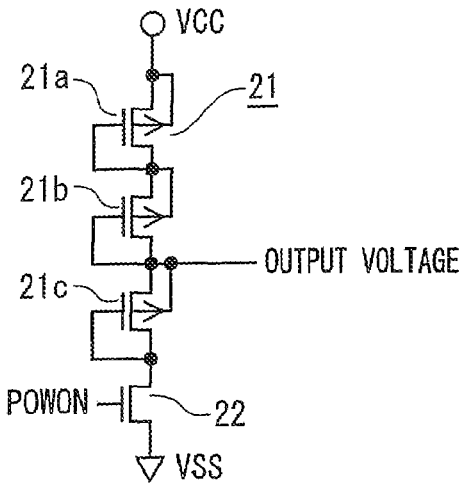
FIG. 6 is a circuit diagram showing a supply voltage dividing circuit which is of a modification of supply voltage dividing circuits 21A, 21B, and 21C of FIG. 5.
FIG. 7 shows all information storage example of a binary memory cell of FIG. 1 according to a third embodiment of the invention.

(2) FIG. 6 is a circuit diagram showing a supply voltage dividing circuit which is a modification of the supply voltage dividing circuits 21A, 21B, and 21C of FIG. 5. The supply voltage dividing circuit 21 includes plural PMOS transistors 21a, 21b, and 21c and an NMOS transistor 22. The PMOS transistors 21a, 21b, and 21c are diode-connected in place of the divided resistors. The NMOS transistor 22 is gate-controlled by the power-on signal POWON. The PMOS transistors 21a, 21b, and 21c and the NMOS transistor 22 are connected in series between the terminal of the supply voltage VCC and the terminal of the ground voltage VSS. The circuit area can be decreased when the supply voltage dividing circuit 21 is used.

Third Embodiment

FIG. 7 shows an information storage example of a binary memory cell of FIG. 1 according to a third embodiment of the invention.

In the third embodiment, a binary memory cell (hereinafter the binary memory cell is designated by the numeral "2a-2") in which two bits are stored in the one memory cell 2a is used as the memory array 2, and a memory cell (hereinafter the memory cell is designated by the numeral "2a-1") in which one bit is stored in the one memory cell 2a is used as the memory areas 3A and 3B in which the trimming and redundant information is stored. FIG. 7 shows an example of the memory cell 2a-2 in which the two bits are stored in the one memory cell 2a.

In the memory cell 2a, assuming that a charge accumulation node at the left side of the floating gate is ND and a charge accumulation node at the right side of the charge accumulation node is NS, the binary memory cell 2a-2 takes four logical storage states (1,1), (0,1), (1,0), and (0,0) according to the presence/absence of the charge in the charge accumulation nodes ND and NS. Each bit is read by the direction of the voltage applied to the source or drain. In reading one of the bits, even in the same logical value, the memory cell current becomes larger when the charge is absent in the charge accumulation node ND or NS corresponding to the other bit.

As described, in the second embodiment, when the trimming and redundant information is read when the power is turned on, the built-in power supply circuit 9 fluctuates because the built-in power supply circuit 9 is in the pre-trimming state, and the voltage applied to the memory cell 2a becomes largely decreased in the worst condition. As a result, the memory cell current necessary for the read operation cannot sufficiently be secured in the unwritten state (i.e., logical value 1).

In the third embodiment, as shown in FIG. 4, only one charge accumulation node (for example, NS) is used as the memory cell 2a-1 in which the trimming and redundant information is stored, and the other charge accumulation node ND is set to the unwritten state of non-use (i.e., logical value 1). Therefore, when the trimming and redundant information is read when the power is turned on, the memory cell current of the logical value 1 can be secured to surely read the trimming and redundant information. Even if the one bit of the trimming and redundant information is stored in the one memory cell 2a-1, since the trimming and redundant information has usually the number of bits which are sufficiently stored in the one word line WL, area overhead is not generated.

In the third embodiment, when the logical value 0 is stored, the charge accumulation node ND, which is set to the non-use can also be used while the logical value 0 is written, i.e., the storage logical value (0,0) of FIG. 7. The off-current can be decreased in the memory cell which is in the written state (i.e., logical value 0), and therefore a read margin can be improved.

Although the memory cell 2a-2 in which the two bits are stored in the one memory cell 2a is described in the third embodiment, the substantially same effect can be also obtained in the case of the use of a multi-value memory cell in which at least four bits are stored.

Fourth Embodiment

Figure 8:
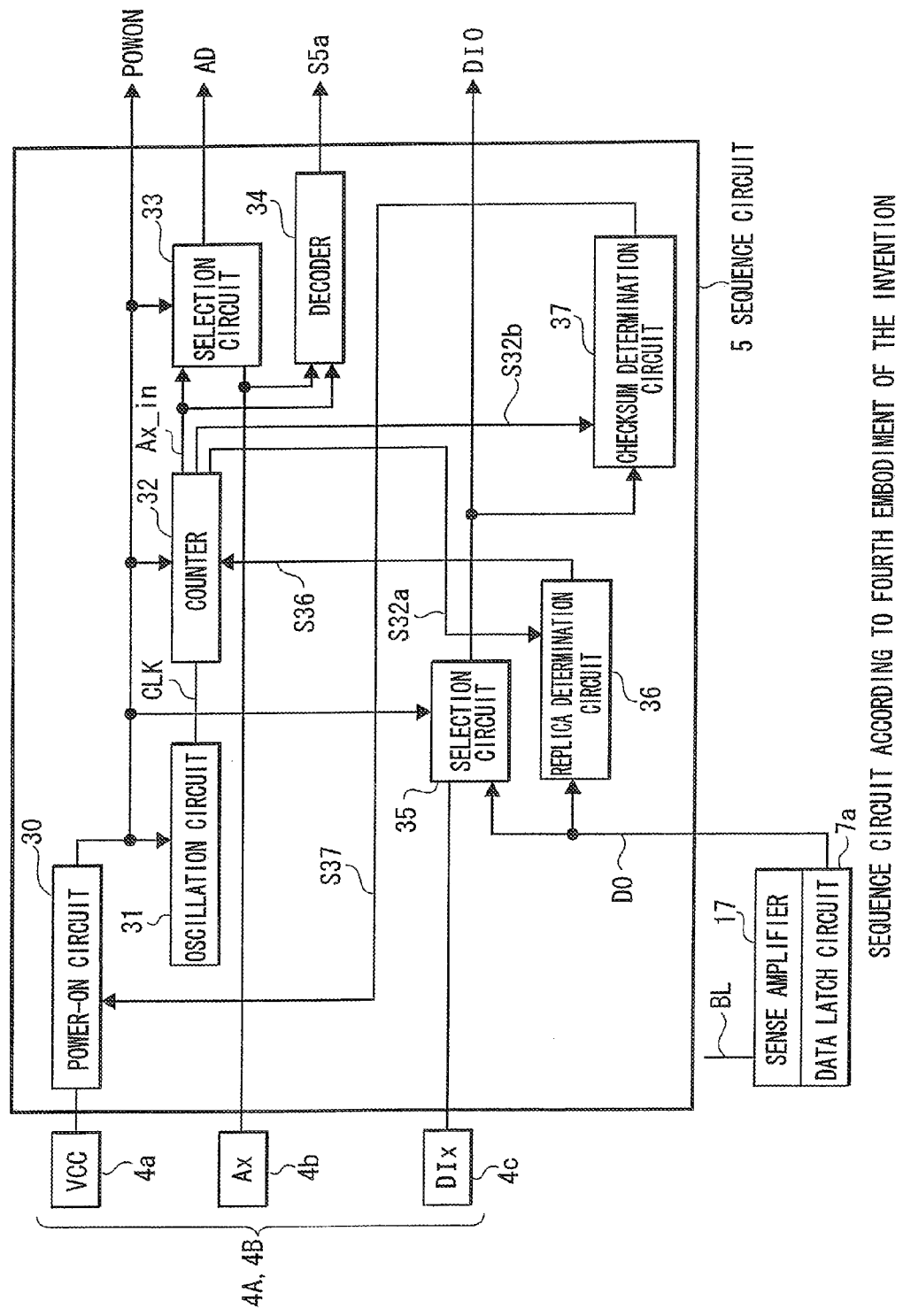
FIG. 8 is a schematic view showing a configuration of a sequence circuit 5 of FIG. 1 according to a fourth embodiment of the invention.

FIG. 8 is a schematic view showing a configuration of a sequence circuit 5 of FIG. 1 according to a fourth embodiment of the invention.

The supply voltage VCC, the memory address Ax, and the input data DIx are inputted to the sequence circuit 5 of the fourth embodiment from an power supply pad 4a, an address pad 4b, and a data input pad 4c in the I/O pads 4A and 4B, respectively. The data latch circuit 7a inputs the memory read data DO to the sequence circuit 5. The sequence circuit 5 performs a predetermined sequence operation to output the memory address AD, the latch selection signal S5a, and the input/output data DIO.

The sequence circuit 5 includes a power-on circuit 30, an oscillation circuit 31, a counter 32, an output stop unit (for example, selection circuit) 33, a decoder 34, an output stop unit (for example, selection circuit) 35, a determination unit (for example, replica determination circuit) 36, and a determination unit (for example, checksum determination circuit) 37. The power-on circuit 30 is connected to the power supply pad 4a. The oscillation circuit 31, the counter 32, and the selection circuit 33 are connected to the power-on circuit 30. The decoder 34 is connected to the output side of the counter 32. The selection circuit 35 is connected to the power-on circuit 30, the data input pad 4c, and the data latch circuit 7a. The replica determination circuit 36 is connected to the counter 32 and the data latch circuit 7a. The checksum determination circuit 37 is connected to the selection circuit 35 and the power-on circuit 30.

When the supply voltage VCC is inputted to the power-on circuit 30 from the power supply pad 4a, the power-on circuit 30 activates the power-on signal POWON (for example, logic "H") to supply the power-on signal POWON to the oscillation circuit 31, the counter 32, and the selection circuits 33 and 35. When a checksum determination circuit 37 supplies a checksum determination matching signal S37 to the power-on circuit 30, the power-on circuit 30 inactivates the power-on signal POWON (for example, logic "L"). The oscillation circuit 31 connected to the output side of the power-on circuit 30 oscillates at a predetermined frequency according to "H" of the power-on signal POWON, and outputs a clock signal CLK to the counter 32. The counter 32 counts the number of pulses of the clock signal CLK by "H" of the power-on signal POWON, and outputs an internal generation address Ax_in, a replica determination timing signal S32a, and a sum computation and determination timing signal S32b to the selection circuit 33, the decoder 34, the replica determination circuit 36, and the checksum determination circuit 37, respectively.

The selection circuit 33 selects the internal generation address Ax_in outputted from the counter 32 when the power-on signal POWON becomes "H", and selects the memory address Ax inputted from the address pad 4 when the power-on signal POWON is "L". The selection circuit 33 outputs the selection result as the memory address AD. The decoder 34 decodes the memory address Ax inputted from the address pad 4b or the internal generation address Ax_in supplied from the counter 32, and outputs the latch selection signal S5a. The selection circuit 35 selects the memory read data DO supplied from the data latch circuit 7a when the power-on circuit 30 supplies "H" of the power-on signal POWON to the selection circuit 35, and selects the input data DIx inputted from the data input pad 4c when the power-on circuit 30 supplies "L" of the power-on signal POWON to the selection circuit 35. The selection circuit 35 outputs the selection result as the input/output data DIO.

On the basis of a replica determination timing signal S32a supplied from the counter 32, the replica determination circuit 36 determines whether or not the memory read data DO supplied from the data latch circuit 7a is matched with a replica (copy data). When the memory read data DO is matched with the replica, the replica determination circuit 36 outputs a replica determination matching signal S36 to the counter 32. On the basis of the sum computation and determination timing signal S32b supplied from the counter 32, the checksum determination circuit 37 determines whether or not the input/output data DIO outputted from the selection circuit 35 is matched with a checksum (total). When the input/output data DIO is matched with the checksum, the checksum determination circuit 37 outputs a checksum determination matching signal S37 to the power-on circuit 30.

(Operation in Fourth Embodiment)

Figure 9:
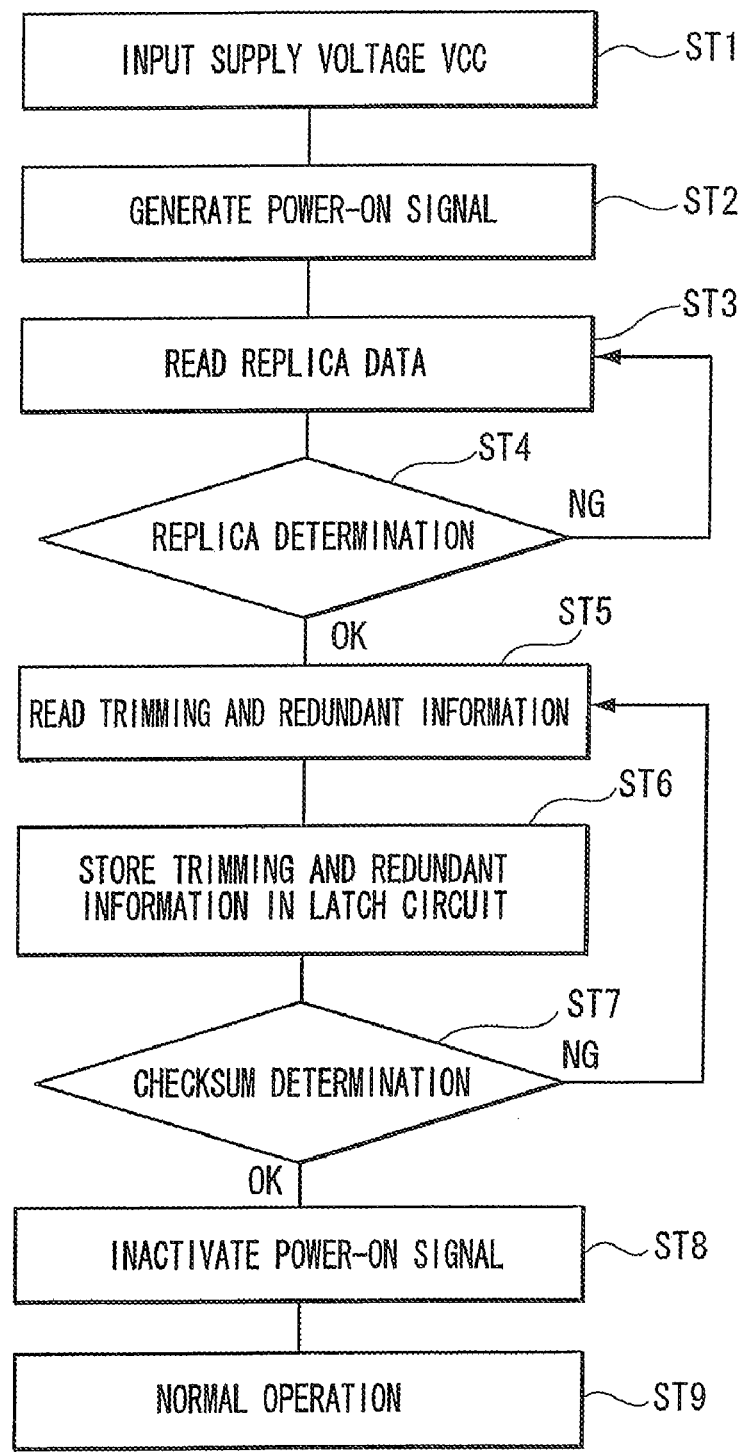
Figure 10:
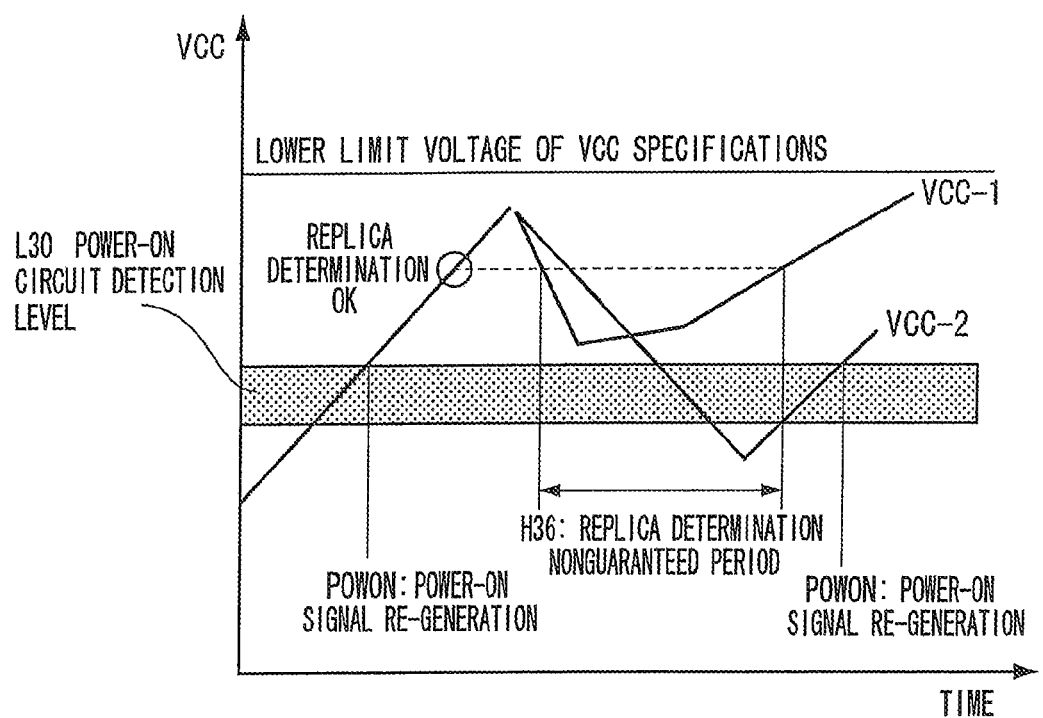
Figure 11A:
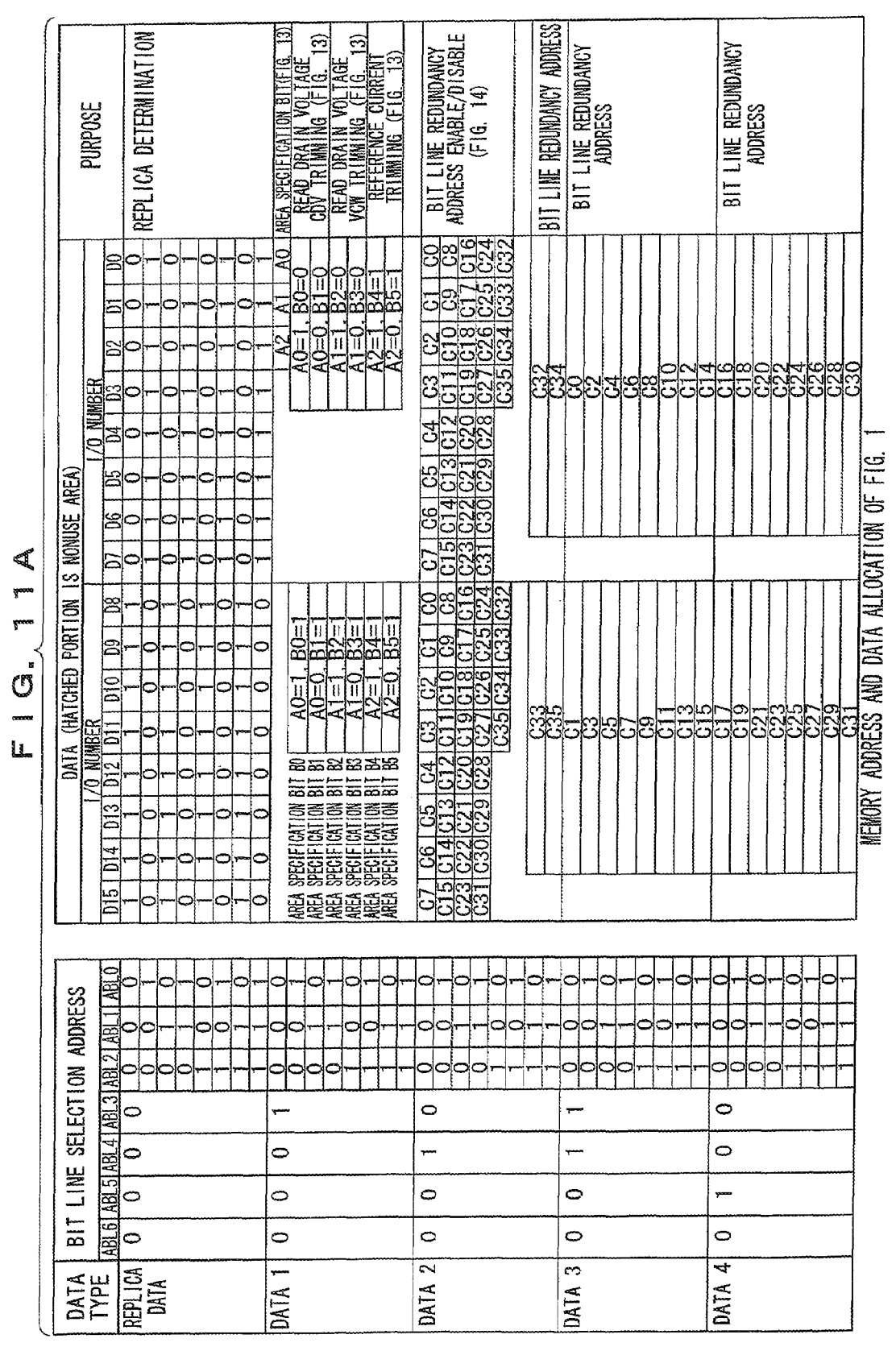
Figure 11B:
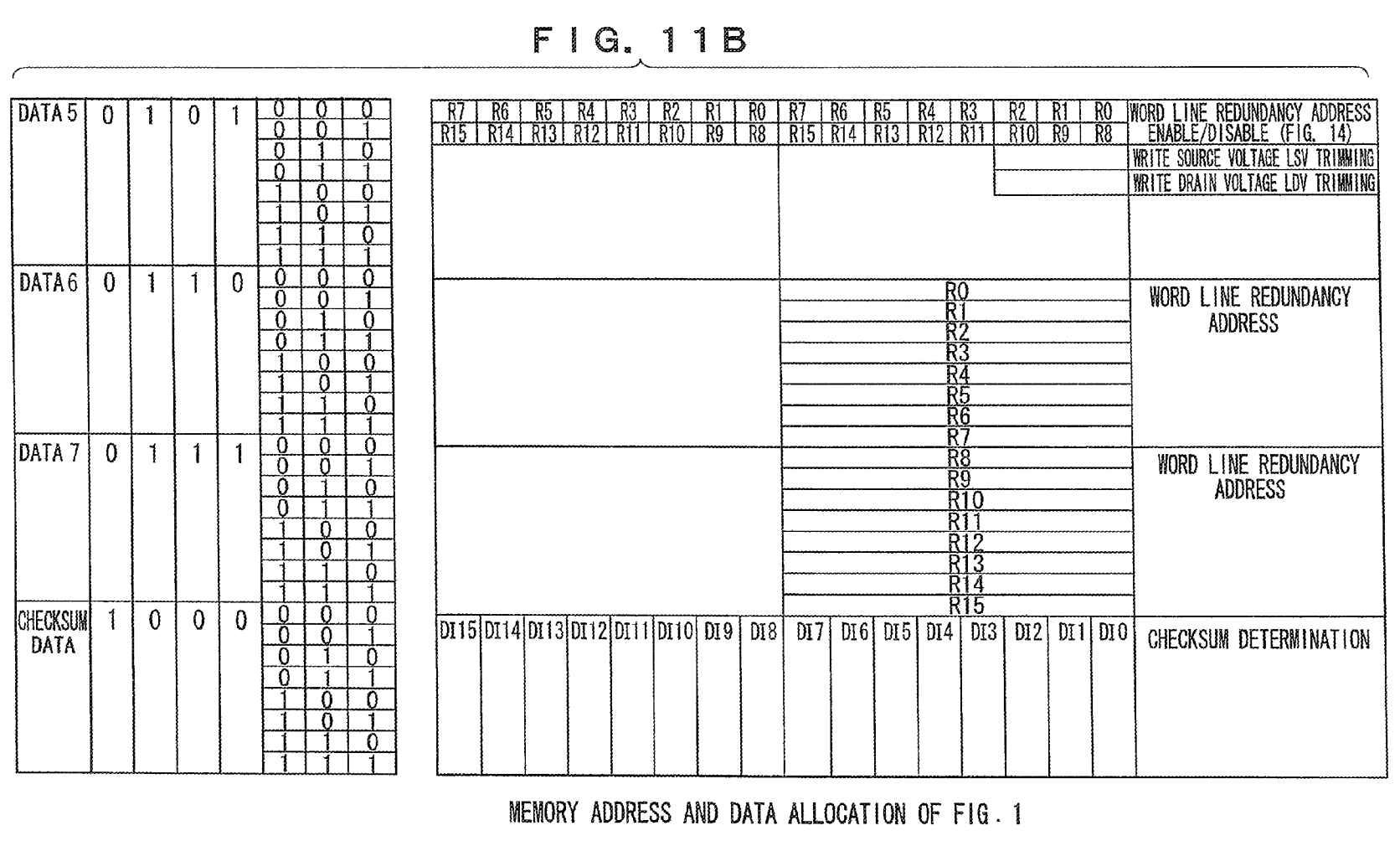

FIG. 9 is a flowchart showing the read operation of the trimming and redundant information when the sequence circuit 5 of FIG. 8 is turned on. FIG. 10 is a waveform chart of the supply voltage VCC when the sequence circuit 5 of FIG. 8 is turned on. In FIG. 10, the horizontal axis indicates time, and the vertical axis indicates a level of supply voltage VCC. FIGS. 11A and 11B show a memory address and data allocation when the trimming and redundant information is stored in the memory areas 3A and 3B of FIG. 1.

In the flowchart of FIG. 9, when the supply voltage VCC is inputted from the power supply pad 4a (Step ST1), a level of the supply voltage VCC is raised. When the power-on circuit 30 detects that the level of the supply voltage VCC is equal to or larger than the voltage at which the logic circuit of the memory chip 1 is operable, and the power-on signal POWON is "H" (Step ST2). Then, the data (i.e., replica data) which is written in the memory array 2 in advance while the logical value is determined is read through the bit line BL and the sense amplifier 17, and the data latch circuit 7a latches the memory read data DO (Step ST3). It is assumed that the replica data includes plural logical values of both 0 and 1 and the pieces of replica data are desirably arranged in the whole area of the memory array.

FIGS. 11A and 11B show an example of the replica data. In the memory chip 1 having 16 outputs in a 128-bit simultaneously reading page mode, the replica data is written in the memory area 3A and 3B in which the trimming and redundant information is stored. Because the replica data is written in the memory cell 2a corresponding to data input/output terminals D0 to D15 of the memory chip 1, the logical values of both 0 and 1 are homogeneously arranged in the word line WL.

The replica determination circuit 36 is provided so as to correspond to the logical value of the replica data in advance and determines whether or not the logical value of the replica data read in Step ST3 is correctly read, (Step ST4). When all the bits are not correctly read (NG in ST4), the read operation is performed again. When all the bits are correctly read (OK in ST4), the trimming and redundant information is read from the memory areas 3A and 3B through the bit line BL, the sense amplifier 17, and the data latch circuit 7a (Step ST5). The data read in Step ST5 is stored in the latch circuits 8A and 8B (Step ST6). When all the pieces of trimming and redundant information are read, the checksum determination circuit 37 makes the checksum determination through the selection circuit 35 as follows (Step ST7).

In the checksum determination, the stun of the logical values of the trimming and redundant information is written in the memory cell 2a in advance. After reading the trimming and redundant information when the power is turned on, the logical value of the trimming and redundant information is added each time of reading the trimming and redundant information. After all the pieces of trimming and redundant information and the sum information are read, the checksum determination circuit 37 determines whether or not the computation result is matched with the sum. The checksum determination will be described below with reference to FIGS. 11A and 11B.

In the example of FIGS. 11A and 11B, 16 one-bit addition circuits corresponding to the data input/output terminals D0 to D15 are incorporated into the checksum determination circuit 37. The sum information is stored in an area of the checksum data. That is, the checksum data is written in advance in each of the areas corresponding to the data input/output terminals D0 to D15 such that the sum of the trimming and redundant information and the logical value of the checksum data is an even number. After reading the trimming and redundant information, one-bit addition computation is performed simultaneously with reading the data until the checksum data is read. When all the computation results of the 16 one-bit addition, circuits are not zero (NG in ST7), the one-bit addition circuits are cleared to perform the read operation of the trimming and redundant information again. When all the computation results of the 16 one-bit addition circuits are zero (OK in ST7), the checksum determination circuit 37 generates the checksum determination matching signal S37 to end the checksum determination period. In the above description, a criterion that the sum is even sum is used. Similarly, a criterion that the sum is odd may be used.

When the checksum determination period is ended (OK in ST7), the power-on signal POWON is the inactivated state of "L" by the checksum determination matching signal S37 generated from the checksum determination circuit 37 (Step ST8). Then, the read operation of the trimming and redundant information is ended when the power is turned on, and the process goes to the normal operation (Step ST9).

During the series of processes of FIG. 9, the input from the outside of the memory chip to the chip input terminal is disabled (for example, the address pad 4b and data input pad 4c of FIG. 8 are not be selected by the selection circuit 33 and 35), and the output to the memory-chip output terminal is prohibited. Before the replica data and the checksum data are written in the memory chip 1, an infinite loop is generated for the memory chip 1 when the power is turned on, and accordingly a forced termination unit is provided.

(Effect of Fourth Embodiment)

As shown in FIG. 10, a lower limit voltage of the supply voltage VCC defined by the memory chip specifications cannot detected in principle by the power-on circuit 30 which is driven by the supply voltage VCC when the power is turned on. A detection level L30 of the power-on circuit 30 fluctuates widely depending on the fluctuation in element, the fluctuation in temperature, and the fluctuation in supply voltage VCC. Therefore, in order to read the trimming and redundant information when the power is turned on, it is necessary that a circuit is configured so as to read the trimming and redundant information at the lower supply voltage VCC in consideration of the fluctuation range separately from the specification range of the supply voltage VCC. Particularly, design is hardly performed when there are constraints on the voltage applied to the memory cell 2a and the securable current.

According to the fourth embodiment, the trimming and redundant information can securely be read by reading the replica data, and therefore the circuit which reads the trimming and redundant information within the range of the supply voltage VCC defined by the memory clip specifications may be formed. For the circuit which is not involved in the trimming, since the circuit which is used in the normal operation can be used, the area overhead is not generated and the design is easily performed.

In the case where a rise speed and a rise waveform of the supply voltage VCC cannot be defined as the memory chip specifications, as shown by a waveform VCC-1 of FIG. 10, the supply voltage VCC drops in reading the trimming and redundant information after the matching result is obtained in the replica data determination (replica determination non-guaranteed period H36). According to the fourth embodiment, the case in which the data is falsely read during the voltage drop can be excluded by providing the checksum determination. In the case where the supply voltage VCC falls down below the detection level L30 of the power-on circuit 30 as shown by a waveform VCC-2 of FIG. 10, the operation is performed again from the generation of the power-on signal POWON.

(Modification of Fourth Embodiment)

Figure 12:
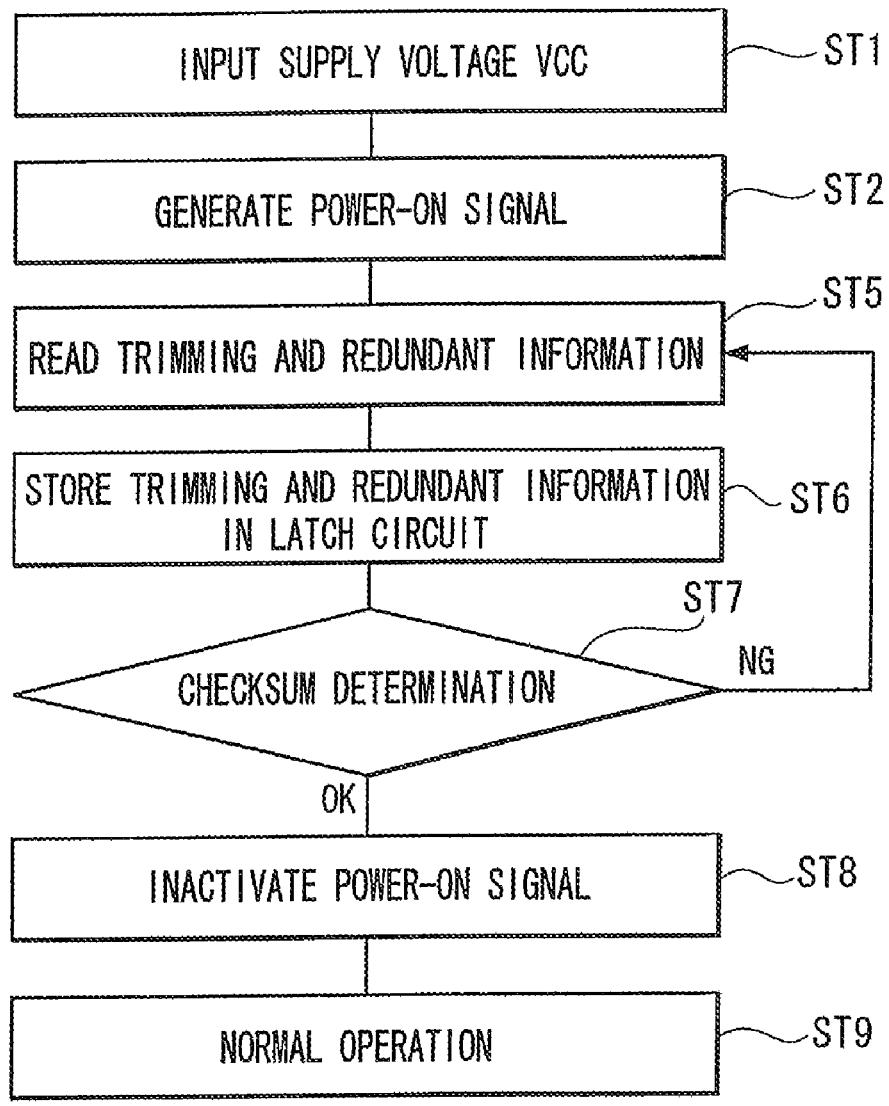

FIG. 12 is a flowchart showing a modification of the read operation of the trimming and redundant information when the sequence circuit 5 of FIG. 8 is turned on. In FIG. 12, the same elements as that of FIG. 9 are designated by the same numerals.

In the fourth embodiment, as shown in the flowchart of FIG. 12, the replica determination process (Steps ST3 and ST4) can be omitted. Therefore, the time necessary to write the replica data in the test can be eliminated, and the circuit area can be decreased by the elimination of the replica determination circuit 36. However, in order to enhance the reliability of the read data, it is necessary to form the addition circuit and the determination circuit which can deal with the number of bits higher than that of FIG. 8.

Fifth Embodiment

FIG. 13 shows the logical value of the trimming information of FIGS. 11A and 11B in the fifth embodiment of the invention. FIG. 14 shows the logical value of the redundancy enable/disable information of FIGS. 11A and 11B in the fifth embodiment.

In FIGS. 11A and 11B, the trimming information storage area of the read drain voltage CDV, the read word line voltage VCW, and the reference current IREF are configured with four data storage areas and two-bit area specification bit. The redundant information area is formed by one redundant address and an address enable/disable bit having two bits.

When the trimming information is read when the power is turned on, the bit line address of the data storage area is specified by an area specification bit A. An area specification bit B is specified with respect to the two pieces of data belonging to the specified bit line address. The logical value is determined as shown in FIG. 13 and stored in the latch circuits 8A and 8B. In this case, it is assumed that 1 is a read logical value of the memory cell 2a in the unwritten state and a value stored in the latch circuits 8A and 8B is set to a reversal value of the read logical value of the memory cell 2a.

According to the fifth embodiment, when the trimming logical value is written as shown in FIG. 13, the trimming logical value can be updated only by the write operation without performing the erase operation. The trimming logical value can be changed at least twice for two areas belonging to the one bit line address, and the trimming logical value can be changed at least four times using the four data storage areas. Even if the defect is generated in the memory cell 2a of the data storage area, another area can be used. Since once the erase operation is performed to the memory cell which stores the trimming and redundant information, other areas, particularly in the first embodiment all the areas of the trimming and redundant information, are simultaneously erased, it is necessary to re-write the data, and therefore the test time increases and the reliability of the memory cell 2a decreases, which can be avoided by the fifth embodiment.

In reading the redundant address enable/disable information when the power is turned on, as shown in FIG. 14, the logical values of the two-bit read data are combined to determine and store the logical value of the enable/disable of the corresponding redundant address in the latch circuit 8A and 8B.

According to the fifth embodiment, when the logical value is written as shown in FIG. 14, the redundant address can be enabled and then disabled only by the write operation without performing the erase operation. In the case where the redundant address, which is enabled once, is improper in the test process, because the redundant address can be disabled again without performing the erase operation, as with the trimming logical value, the increase in test time and the decrease in reliability of the memory cell 2a can be avoided.

In the example of FIGS. 11A and 11B, because one bit is added for each data input/output terminal, eight bits are ensured for the checksum data to which one bit is originally enough. As described above, when the logical value is changed in the trimming and redundant information area, it is necessary to re-write the checksum data area in conjunction with the change of the logical value. In the fifth embodiment, one-bit adding determination and the plural checksum data bits are combined, which allows the trimming and redundant information to be re-written only by the write operation without the erase operation.

Sixth Embodiment

A sixth embodiment of the invention will be described with reference to FIGS. 11A and 11B. In the layout of the memory chip 1 of FIG. 2, the latch circuit 8B in which the word line redundant address information is stored is arranged in the upper portion of the memory array 2 while being adjacent to the word line repair circuit 10, and the latch circuit 8A in which the bit line redundant address information is stored is arranged in the lower portion of the memory array 2 while being adjacent to the bit line repair circuit 14.

In the storage example of the redundant information data of FIGS. 11A and 11B, the redundant address storing latch circuit has the 380 output signal lines. On the other hand, the 14 input data lines are required to the latch circuit at a maximum. Therefore, the above-mentioned arrangement largely decreases the wiring area.

According to the sixth embodiment, the latch circuit 8A and 8B in which the trimming and redundant information is stored are arranged so as to be adjacent to the circuits 10 and 14 which use the output signals of the latch circuit 8A and 8B. Therefore, the wiring area of the output signals of the latch circuit 8A and 8B can be decreased to avoid the increase in chip area.

Seventh Embodiment (Configuration of Seventh Embodiment)

Figure 15:
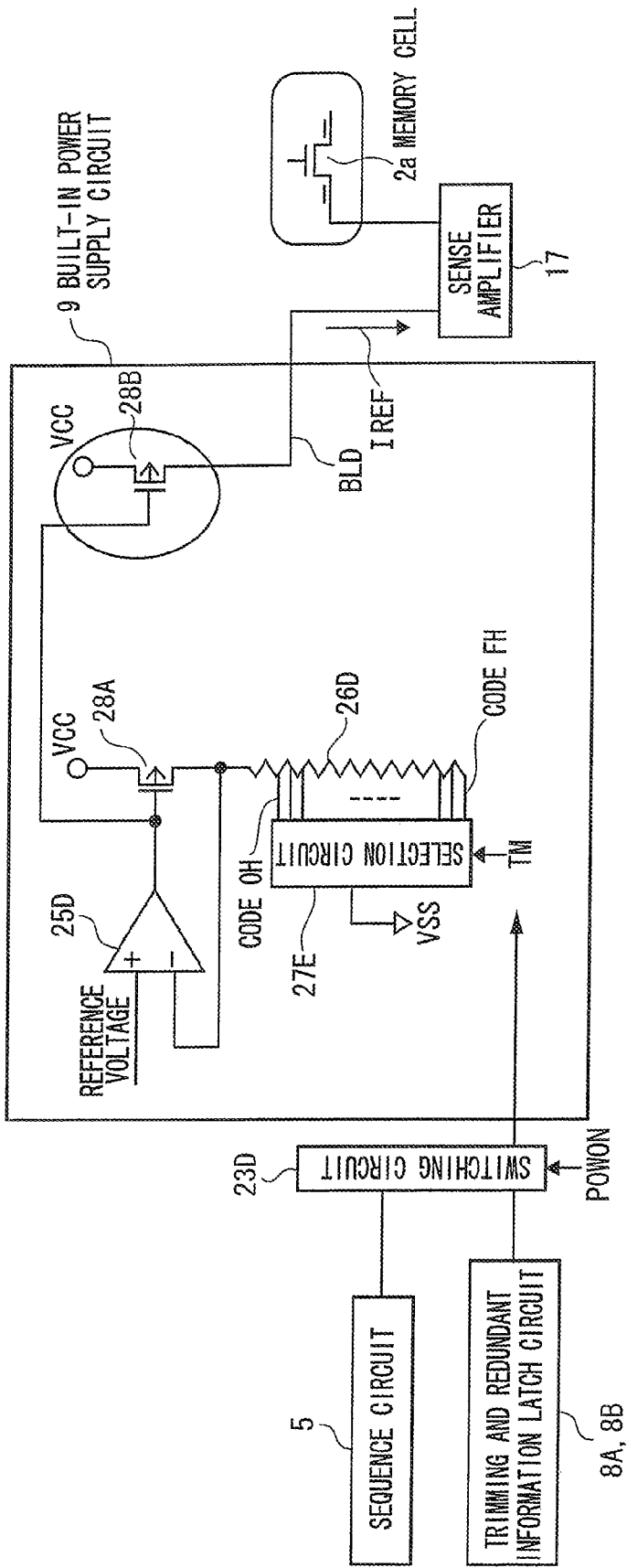
FIG. 15 is a schematic view showing a configuration of a reference current trimming value automatically optimizing circuit according to a seventh embodiment of the invention provided in the built-in power supply circuit 9 of FIGS. 1 and 5.

FIG. 15 is a schematic view showing a configuration of a reference current trimming value automatically optimizing circuit according to a seventh embodiment of the invention provided in the built-in power supply circuit 9 of FIGS. 1 and 5.

The reference current trimming value automatically optimizing circuit includes the operational amplifier 25D, the resistor dividing circuit 26D, the current source 28A formed by the PMOS transistor, the reference current source 28B formed by the PMON transistor, a selection circuit 27E, and a switching circuit 23D. The selection circuit 27E is provided in place of the selection circuit 27D of FIG. 5. The switching circuit 23D generates the trimming signal TM supplied to the selection circuit 27E.

The switching circuit 23D selects the output signal of the sequence circuit 5 when the power-on signal POWON is "H" when the power is turned on, and selects the output signals of the latch circuits 8A and 8B of the trimming and redundant information when the power-on signal POWON is "L" after the power is turned on. The switching circuit 23D supplies the trimming signal TM as the selection result to the selection circuit 27E. The selection circuit 27E outputs codes fh to 0h corresponding to the trimming signal TM to change the divided voltage of the resistor dividing circuit 26D connected to the ground voltage VSS, and thereby the selection circuit 27E selects the trimming value for determining the value of the reference current IREF. In the resistor dividing circuit 26D, for example, the trimming value in which the resistor is the shortest (i.e., reference current is the maximum) is allocated as four-bit code 0h, and the trimming value in which the resistor is the longest (i.e., reference current is the minimum) is allocated as four-bit code fh.

(Operation in Seventh Embodiment)

FIG. 16 is a waveform chart showing a power-on sequence in which the reference current trimming value automatically optimizing circuit of FIGS. 8 and 15 is used. FIG. 16 corresponds to the operation in the flowchart of FIG. 9.

When the supply voltage VCC is imprinted, the level of the supply voltage VCC is raised, the power-on signal POWON becomes "H" in the sequence circuit 5, and a chip select signal CEB_in, an output enable signal OEB_in, the word line selection address AWLx_in, and the bit line selection address ABLx_in are generated.

The replica data written in the memory array 2 in advance is read based on the word line selection address AWLx_μin and the bit line selection address ABLx_in. Using a determination timing signal generated at each time tACC, the sequence circuit 5 determines whether or not the logical value of the replica data is correctly read. When all the bits of the replica data are not correctly read, the read operation is performed again.

During the replica determination period, the sequence circuit 5 generates the word line selection address AWLx_in and the reference current trimming value (trimming signal TM) as described in the first embodiment, and makes the determination while the word line selection address AWLx_in and the trimming signal TM are changed in each read operation. The trimming signal TM is supplied to the selection circuit 27E of the built-in power supply circuit 9 through the switching circuit 23D. The selection circuit 27E sequentially selects the codes 0h to fh to change the divided voltage of the resistor dividing circuit 26D based on the timing signal TM. The reference current IREF passes through the reference bit line BLD is changed by the divided voltage, which performs the trimming of the reference voltage VREF supplied to the sense amplifier 17. In FIG. 16, the reference current trimming value is changed from the code 0h having the large reference current to the code fh having the small reference current.

When the all the bits are correctly read, the trimming and the redundant information (data 1 to 7 and checksum data) are read from the memory area 3A and 3B, and the data 1 to 7 and checksum data are stored in the latch circuit 8A and 8B of FIG. 1. The checksum determination is made when all the trimming and redundant information (data 1 to 7 and checksum data) is read.

When the checksum determination period is end, the power-on signal POWON becomes "L" in the sequence circuit 5, the trimming and redundant information read operation is ended when the power is turned on, and then the process goes to the normal operation.

(Effect of Seventh Embodiment)

According to the seventh embodiment, for each memory chip, a readable condition can automatically be determined to read the trimming and redundant information independently of the fluctuation of the elements, fluctuation in memory characteristics, and a temperature when the power is turned on.

Further, in the operation example of FIG. 16, the reference current trimming value (trimming signal TM) is changed from the code 0h having the large reference current IREF to the code fh having the small reference current IREF. Because generally the supply voltage VCC tends to be increased when the power is turned on, the voltage applied to the memory cell 2a tends to be increased with time when the supply voltage dividing circuit 21C of FIG. 5 of the second embodiment is used. Therefore, the trimming value, which can be read in the process wherein the reference current IREF increases, might not be read because the off current of the memory cell 2a where the logical value 0 is written exceeds the reference current IREF after the supply voltage VCC is increased, which can be prevented in the seventh embodiment.

Eighth Embodiment

An eighth embodiment of the invention will be described with reference to FIG. 16 showing an operation waveform chart.

A read access time of the memory area 3A and 3B in which the trimming and redundant information is stored is expressed as the time tACC until the determination timing signal (S32a of FIG. 8) or a transfer period signal to the trimming and redundant information latch circuits 8A and 8B rises since the internal addresses (AWLx_in and ABLx_in) are generated by the sequence circuit 5 of FIG. 1. In the eighth embodiment, the time tACC is set longer than the access time defined as user specifications in the normal operation.

According to the eighth embodiment, as described in the second embodiment, even if the memory cell current necessary for the read operation is decreased in the pre-trimming, the voltage difference necessary for the sensing operation of the sense amplifier 17 can be secured to stably read the trimming and redundant information.

Ninth Embodiment

A ninth embodiment of the invention will be described with reference to FIG. 17.

FIG. 17 is a waveform chart showing a write operation of FIGS. 1 and 8 in which the trimming and redundant information is stored in the memory area in the ninth embodiment of the invention. FIG. 17 shows an operation example of the 16-bit input/output memory chip 1 having a 128-bit simultaneously writing mode.

When the output enable signal OEB falls from "H" to "L", the control signal (test mode signal TEST) which is outputted from the mode control logic circuit 6 of FIG. 1 becomes "H" to set the data latch unit 7 to the test mode, and the sequence circuit 5 outputs the bit line selection address ABLx and the latch signal S5a.

The pieces of input data DIx written in the memory area 3A and 3B as the write test are inputted to the I/O pad 4B of the memory chip 1 while divided into eight times by 16 bits, and the voltage is applied to the memory cell 2a to simultaneously write all the pieces of 128-bit input data DIx in a period tpw during when the chip enable signal CEB is "L".

The feature of the ninth embodiment is that, before the voltage applied to the memory cell 2a, the test input data DIx is inputted to the I/O pad 4B by the data input from the external terminal, and thereby the storage value of the trimming and redundant information latch circuits 8A and 8B is updated in the order of 0, 1, 2, . . . , and 7 by the latch selection signal S5a. After the test input data DIx is inputted, the voltage application to the memory cell 2a is stopped, which allows the trimming and redundant information to be set without writing the trimming and redundant information in the memory cell 2a. Therefore, the memory chip 1 can be tested without any voltage stress and any write time of the trimming and redundant information in the memory cell 2a.

Tenth Embodiment

FIG. 18 is a block diagram showing an example of trimming terminals of FIG. 1 in a tenth embodiment.

The memory chip 1 of the tenth embodiment includes the I/O pad 4B, the data latch unit 7, the built-in power supply circuit 9 of FIG. 5, and plural pads (for example, a pad voltage CDV pad 61, a word voltage VCW pad 62, and a reference current monitoring pad 63). Furthermore, plural (x) data DOx output terminals (for example, a data DO1 output terminal 71, a data DO2 output terminal 72, and a data DO3 output terminal 73) which are external terminals are connected to the outside of the memory chip 1.

The I/O pad 4B includes plural (x) data DOx output pads (for example, a data DO1 output pad 41, a data DO2 output pad 42, and a data DO3 outpad 43). As shown in FIG. 1, the data latch unit 7 includes the data latch circuit 7a, the ECC circuit 7b, and the logic circuit 7c. In order to output the data to the outside from the circuits 7a, 7b, and 7c, plural output circuits 51, 52, and 53 are provided within or outside of the circuits 7a, 7b and 7c, and plural switching circuits 54, 55, and 56 are connected to the output sides of the output circuits 51, 52, and 53. The data DOx output pads 41 to 43 and the data DOx output terminals 71 to 73 are connected to the output sides of the switching circuits 54 to 56.

As shown in FIG. 5, the built-in power supply circuit 9 includes the voltage generation unit 9A, the voltage generation unit 9B, and the current-mirror circuit 9C. The voltage generation unit 9A includes the operational amplifier 25B for outputting the drain voltage CDV and the plural circuits connected to the input side of the operational amplifier 25B. The voltage generation unit 9B includes the operational amplifier 25A for outputting the word voltage VCW and the plural circuits connected to the input side of the operational amplifier 25A. The current-mirror circuit 9C includes the current source 28A, and the reference current source 28B for outputting the reference current IREF, and the plural circuits connected to the input side of the current source 28A and reference current source 28B. Output-side nodes N9A, N9B, and N9C of the voltage generation unit 9A, voltage generation unit 9B, and current-mirror circuit 9C are connected to the drain voltage CDV pad 61 the word voltage VCW pad 62, and the reference current monitoring pad 63, respectively, and the output-side nodes N9A, N9B, and N9C thereof are also connected to the switching circuits 54 to 56, respectively.

When the test mode signal TEST is, for example, "H", the switching circuit 54 selects the drain voltage CDV which is the output from the voltage generation unit 9A, and outputs the drain voltage CDV to the data DO1 output pad 41 and the data DO1 output terminal 71. When the test mode signal TEST is "L", the switching circuit 54 selects and outputs the output signal of the output circuit 51 to the data DO1 output pad 41 and the data DO1 output terminal 71.

Similarly, when the test mode signal TEST is "H", the switching circuit 55 selects and outputs the word voltage VCW which is outputted from the voltage generation unit 9B to the data DO2 output pad 42 and the data DO2 output terminal 72. When the test mode signal TEST is "L", the switching circuit 55 selects and outputs the output signal of the output circuit 52 to the data DO2 output pad 42 and the data DO2 output terminal 72. Similarly, when the test mode signal TEST is "H", the switching circuit 56 selects and outputs the reference current IREF which is outputted from the voltage generation unit 9C to the data DO3 output pad 43 and the data DO3 output terminal 73. When the test mode signal TEST is "L", the switching circuit 56 selects and outputs the output signal of the output circuit 53 to the data DO3 output pad 43 and the data DO3 output terminal 73.

According to the trimming terminal configuration of the tenth embodiment, using the test mode signal TEST, the switching circuits 54 to 56 can switch between the signals of the output nodes N9A, N9B, and N9C of the voltage trimming target built-in power supply circuit 9 and the output signals of the output circuits 51 to 53, and output the signals to the data DOx output terminals 71 to 73.

In the tenth embodiment, the signals of the trimming target output nodes N9A, N9B, and N9C are outputted to the data DOx output terminals 71 to 73. Alternatively, while the data DOx output terminals 71 to 73 are not provided, the signals can be outputted to the chip input/output terminals, such as address terminals, which are not used during the trimming. Therefore, the trimming of the built-in supply voltage and the reference current can be performed after the assembly without increasing the number of already-existing chip external terminals.

An embodiment of the present invention is described above, but the present invention is not limited to the embodiment as will be clear to those skilled in the art.

The semiconductor nonvolatile memory such as EPROM includes a memory array, plural memory areas, a sequence circuit, a write-read unit, a latch circuit, and a selection drive unit.

Plural first nonvolatile memory cells are arranged in the memory array. The plural memory areas are arranged in the memory array, and plural memory areas respectively have plural second nonvolatile memory cells in which the same predetermined information is stored. The sequence circuit generates a memory address, a latch selection signal, and a control signal at predetermined timings when the power is turned on.

The write-read unit writes and reads information in and from the memory array and the memory area based on the memory address and the control signal. On the basis of the latch selection signal, the latch circuit latches the predetermined information read by the write-read unit. The selection drive unit selects the first and second nonvolatile memory cells based on the memory address and the predetermined information latched by the latch circuit, and applies a predetermined voltage to drive the first and second nonvolatile memory cells.

Thus, in the above configuration, the predetermined information such as the same trimming and redundant information is stored in the plural memory areas in an overlapping manner, so that reliability of the memory area in which the predetermined information such as the same trimming and redundant information is stored can be enhanced. Furthermore, the memory block is formed only by the plural memory areas in which the predetermined information such as the same trimming and redundant information is stored. Therefore, the predetermined information such as the same trimming and redundant information is not simultaneously erased nor disturbed when another memory array is erased, which allows the reliability of the memory cell to be enhanced while facilitating test.

What is claimed is:

1. A semiconductor nonvolatile memory comprising:
a memory array in which a plurality of first nonvolatile memory cells are arranged;
a plurality of memory areas which are arranged in the memory array and have a plurality of second nonvolatile memory cells in which the same predetermined information is stored;
a sequence circuit which generates a memory address, a latch selection signal, and a control signal at predetermined timings when a power is turned on;
a write-read unit which writes and reads information to and from the memory array and the memory areas based on the memory address and the control signal;
a latch circuit which latches the predetermined information which is read by the write-read unit, based on the latch selection signal; and
a selection-drive unit which selects the first or second nonvolatile memory cells based on the memory address and the predetermined information latched by the latch circuit and applies a predetermined voltage to drive the selected first or second nonvolatile memory cells,
wherein the plurality of second nonvolatile memory cells respectively store logical information values of both 0 and 1 as the predetermined information, and the sequence circuit comprises a determination unit,
wherein the determination unit carries out repeated cycles of reading the plurality of second nonvolatile memory cells through the write-read unit in a read operation when the power is turned on, determines whether or not all of the read logical values are matched with the logical information values, and causes the write-read unit to read the predetermined information when all of the read logical values are matched with the logical information values.

2. The semiconductor nonvolatile memory of claim 1, wherein a trimming logical value is changed until a determination result by the determination unit is matched.

3. The semiconductor nonvolatile memory of claim 1, wherein the plurality of memory areas are sequentially read until a determination result by the determination unit is matched.

4. A semiconductor nonvolatile memory comprising:
a memory array in which a plurality of first nonvolatile memory cells are arranged;
a plurality of memory areas which are arranged in the memory array and have a plurality of second nonvolatile memory cells in which the same predetermined information is stored;
a sequence circuit which generates a memory address, a latch selection signal, and a control signal at predetermined timings when a power is turned on;
a write-read unit which writes and reads information to and from the memory array and the memory areas based on the memory address and the control signal;
a latch circuit which latches the predetermined information which is read by the write-read unit, based on the latch selection signal; and
a selection-drive unit which selects the first or second nonvolatile memory cells based on the memory address and the predetermined information latched by the latch circuit and applies a predetermined voltage to drive the selected first or second nonvolatile memory cells,
wherein the sequence circuit comprises a determination unit, and
wherein the determination unit
reads the predetermined information which is stored in each of the plurality of second nonvolatile memory cells and carries out a computation on the read predetermined information in a read operation when the power is turned on,
after reading all of the predetermined information, compares the computed predetermined information and information which is read through the write-read unit and which was computed and written in advance when the predetermined information was written to the second nonvolatile memory cells, and
reads the predetermined information of the second nonvolatile memory cells through the write-read unit until a comparison result of the computed predetermined information and the information computer and written in advance match.

* * * * *